(12) United States Patent
Ogura et al.

(10) Patent No.: US 7,304,340 B2
(45) Date of Patent: Dec. 4, 2007

(54) SEMICONDUCTOR STORAGE ELEMENTS, SEMICONDUCTOR DEVICE MANUFACTURING METHODS THEREFOR, PORTABLE ELECTRONIC EQUIPMENT AND IC CARD

(75) Inventors: Takayuki Ogura, Nara (JP); Hiroshi Iwata, Nara-ken (JP); Akihide Shibata, Nara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 0 days.

(21) Appl. No.: 10/848,323

(22) Filed: May 19, 2004

(65) Prior Publication Data

US 2004/0266109 A1    Dec. 30, 2004

(30) Foreign Application Priority Data

May 20, 2003    (JP) .......................... P2003-142277

(51) Int. Cl.
    *H01L 29/76* (2006.01)
(52) U.S. Cl. ...................... 257/296; 257/288; 257/368; 257/405; 257/406; 257/411
(58) Field of Classification Search ................ 257/296, 257/288, 368, 405, 406, 411
    See application file for complete search history.

(56) References Cited

U.S. PATENT DOCUMENTS 5,448,513 A * 9/1995 Hu et al. ..................... 365/150
6,303,516 B1 * 10/2001 Morita et al. ................ 438/758
6,740,927 B1 * 5/2004 Jeng ............................ 257/315
6,815,763 B2 * 11/2004 Osabe et al. ................. 257/324
2003/0161192 A1 * 8/2003 Kobayashi et al. ......... 365/200

FOREIGN PATENT DOCUMENTS

| JP | 5-81072 B2 | 11/1993 |
| JP | 9-116119 A | 5/1997 |
| JP | 2001-156188 A | 6/2001 |
| JP | 2001-230332 A | 8/2001 |
| JP | 2002-190535 A | 7/2002 |
| WO | WO 03/075358 A1 | 9/2003 |
| WO | WO 03/075359 A1 | 9/2003 |
| WO | WO 03/103058 A1 | 12/2003 |

OTHER PUBLICATIONS

Fujio Masuoka; A Handbook for Flash Memory Technology, K.K. Science Forum, Aug. 15, 1993, pp. 55-58.

* cited by examiner

*Primary Examiner*—Evan Pert
*Assistant Examiner*—Tan Tran
(74) *Attorney, Agent, or Firm*—Birch, Stewart, Kolasch & Birch, LLP

(57) ABSTRACT

A semiconductor storage element has a memory function body on opposite sides of a gate electrode formed on a semiconductor substrate. Each end of source/drain regions is located in the semiconductor substrate just under the memory function body and offset with respect to an edge of the gate electrode in a gate length direction to improve efficiency of electric charge injection into the memory function body. A storage state in the memory function body is found by detecting a amount of current between the source/drain regions, which current changes depending on the amount of the electric charge retained in the charge retention portion.

8 Claims, 22 Drawing Sheets

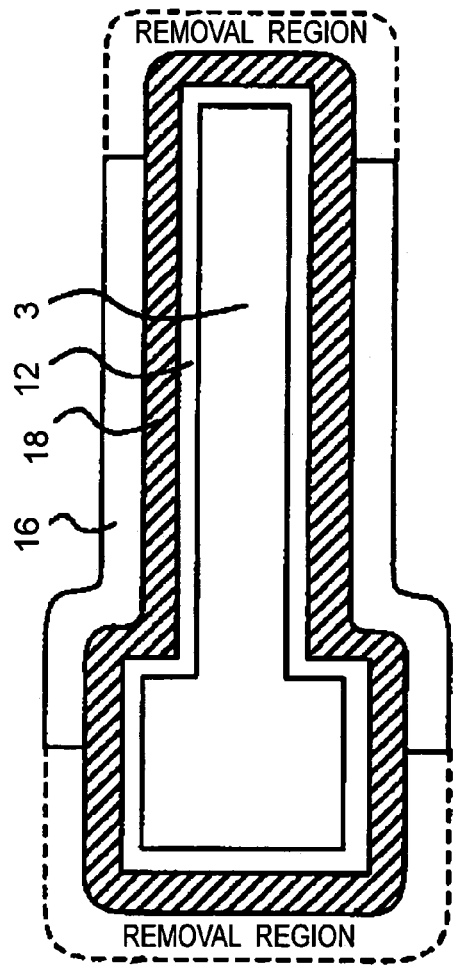
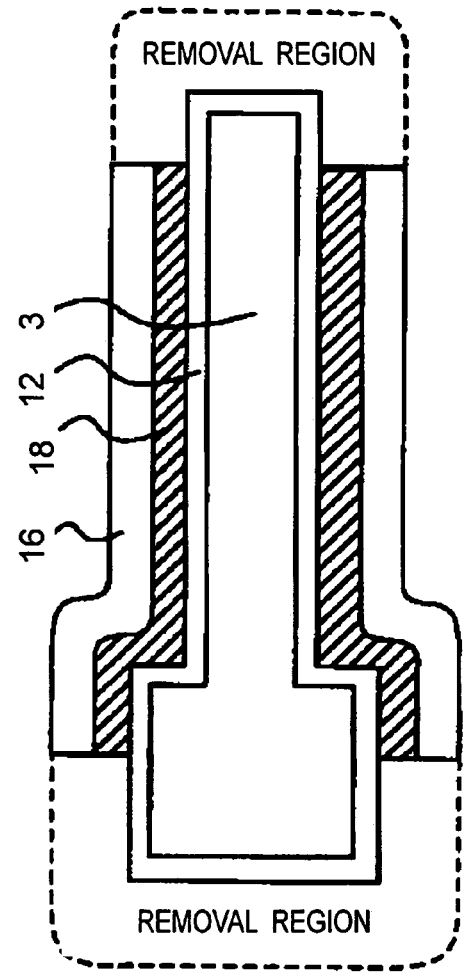
Fig.7A
Fig.7B

SEMICONDUCTOR STORAGE ELEMENTS, SEMICONDUCTOR DEVICE MANUFACTURING METHODS THEREFOR, PORTABLE ELECTRONIC EQUIPMENT AND IC CARD

CROSS-REFERENCE TO RELATED APPLICATIONS

This nonprovisional application claims priority under 35 U.S.C. § 119(a) on Patent Application No. 2003-142277 filed in Japan on May 20, 2003, the entire contents of which are incorporated herein by reference.

BACKGROUND OF THE INVENTION

The present invention relates to a semiconductor storage element, a semiconductor device and manufacturing methods therefor as well as a semiconductor device in which a semiconductor storage element and a semiconductor switching element are consolidated on an identical substrate and a manufacturing method therefor. The present invention also relates to portable electronic equipment and an IC card provided with the above-stated semiconductor device.

Conventionally, there has been a flash memory as a memory device being electrically writable and erasable. As shown in a sectional view of FIG. 19, the conventional flash memory has a floating gate 906 made of polysilicon and arranged on a semiconductor substrate 901 via a first oxide 904, a control gate 907 made of polysilicon and arranged on the floating gate 906 via a second oxide 905, and a pair of source/drain diffusion regions 902 and 903 arranged in the surface of the semiconductor substrate 901. This flash memory constitutes a field-effect transistor (hereinafter referred to as FET), where the control gate 907 operates similarly to the gate electrode of the FET. The first oxide 904, the floating gate 906 and the second oxide 905 are arranged between the control gate 907 and the semiconductor substrate 901. That is, the flash memory includes a memory film (i.e. the floating gate 906) having a charge storage function and arranged in a position corresponding to the gate insulator of the FET, so that the flash memory executes storage, read and erase operations by changing the threshold voltage of the FET according to the amount of charge accumulated in this memory film.

The conventional flash memory has a problem that the memory characteristics deteriorate due to so-called overerase (Masuoka Fujio, "Flash Memory Technology Handbook", Science Forum Co., Ltd., Aug. 15, 1993, P 55-58). That is, the overerase is caused by excessive extraction of electrons or the injection of positive holes when the flash memory executes the erase operation by extracting the electrons accumulated in the floating gate 906 or injecting positive holes into the floating gate 906. Due to this overerase, the floating gate 906 is electrically positively charged, and the FET is turned on by the influence of the positive electric charge, disadvantageously causing a leakage current flowing between the source/drain diffusion regions. This leakage current is attributed to the fact that the control gate 907 corresponding to the gate electrode of the FET and the floating gate 906 that serves as the memory film are stacked and the FET is turned on and off only by the electric charge retained in the floating gate 906.

A memory cell array formed of the aforementioned flash memory cells has a problem that the current of a selected memory cell cannot be extracted during the read of the selected memory cell due to the leakage current generated from non-selected memory cells, causing a read error.

SUMMARY OF THE INVENTION

Accordingly, an embodiment of the present invention provides a semiconductor storage element whose memory characteristics hardly deteriorate.

An embodiment of the present invention provides a semiconductor storage element comprising:
  a gate electrode formed on a semiconductor substrate via a gate insulator;
  a channel forming region located below the gate electrode;
  a pair of source/drain diffusion regions formed on opposite sides of the channel forming region and having a conductive type opposite to a conductive type of the channel forming region; and
  a memory function body arranged on opposite sides of the gate electrode, wherein
  the memory function body is formed of:
    a plurality of charge retention portions constructed of particles having a function to accumulate electric charge and dielectric films formed on surfaces of the particles, having a function to prevent the electric charge from dispersing and having a roughly uniform film thickness and
    an insulator that covers the plurality of charge retention portions, and wherein
  an amount of electric charge retained in the memory function body varies an amount of a current which flows from one source/drain diffusion region to the other source/drain diffusion region when a voltage is applied to the gate electrode.

According to the semiconductor storage element of the above-mentioned construction, the memory function bodies that produce the memory function by accumulating electric charge are formed not in the position corresponding to the gate insulator of the FET (Field-Effect Transistor) but on the sides of the gate electrode. Therefore, even if the memory function bodies are electrically charged by the excessive extraction of the electric charge accumulated in the memory function bodies during, for example, erase, no leakage current flows between the source/drain diffusion regions since the memory function bodies are located on the sides of the gate electrode. As a result, this semiconductor storage element effectively eliminates the problem of overerase and the read error attributed to this overerase as in the conventional case.

Moreover, the memory function bodies are constructed of the particles that have the function to accumulate electric charge and are covered with the dielectric films that are formed on the surfaces of the particles and have the function to prevent the dispersion of electric charge and have a roughly uniform thickness. Therefore, the influence of variations in the size of the particles exerted on the threshold voltage of the FET can be effectively restrained. As a result, a semiconductor storage element of a reduced amount of read errors can be obtained. Moreover, since the dispersion of the electric charge accumulated in the particles is prevented by the dielectric films, a semiconductor storage element with high reliability can be obtained.

It is to be noted that the term of "particle" in this specification means a particle that has a dimension of a nanometer (nm) order.

In the semiconductor storage element of one embodiment, an interval is provided between the gate electrode and the source/drain diffusion regions in a gate length direction.

According to the above-mentioned embodiment, the interval (offset region) is provided between the gate electrode and the source/drain diffusion regions in the gate length direction. This improves the efficiency of electric charge injection into the memory function bodies formed on the sides of the gate electrode. Therefore, a two-bit storage type semiconductor storage element that has a satisfactory characteristic with increased write and the erase speed can be obtained.

An embodiment of the present invention also provides a semiconductor device comprising:

a semiconductor storage element in a memory region arranged on a semiconductor substrate and a semiconductor switching element in a logic circuit region arranged on the semiconductor substrate, wherein the memory region and the logic circuit region are arranged on a semiconductor substrate, wherein the semiconductor storage element and the semiconductor switching element are each constructed of a field-effect transistor, wherein the field-effect transistor has a gate electrode formed on the semiconductor substrate via a gate insulator, a channel forming region located below the gate electrode and a pair of source/drain diffusion regions formed on opposite sides of the channel forming region and having a conductive type opposite to a conductive type of the channel forming region, wherein at least the semiconductor storage element has a memory function body arranged on opposite sides of the gate electrode, wherein the memory function body is formed of:

a plurality of charge retention portions constructed of particles having a function to accumulate electric charge and dielectric films formed on surfaces of the particles, having a function to prevent dispersion of the electric charge and having a roughly uniform film thickness and an insulator that covers the plurality of charge retention portions, wherein the semiconductor switching element has the source/drain diffusion regions of at least partially located below the gate electrode, and wherein the semiconductor storage element has an interval provided between the gate electrode and the source/drain diffusion regions in a gate length direction.

In the semiconductor device of the above-mentioned construction, the memory region having the semiconductor storage element and the logic circuit region having the semiconductor switching element are arranged on the semiconductor substrate. That is, the semiconductor storage element and the semiconductor switching element are consolidated on the identical substrate. The semiconductor storage element changes the amount of a current flowing from one source/drain diffusion region to the other source/drain diffusion region by the amount of the retention electric charge. The semiconductor switching element does not change the amount of the current flowing from one source/drain diffusion region to the other source/drain diffusion region by the amount of the retention electric charge to the extent that the device operation is influenced even if the retention electric charges can be retained. At least in the semiconductor storage element, the memory function body is arranged on opposite sides of the gate electrode. The memory function body is formed of the plurality of charge retention portions. The charge retention portions are constructed of the particles having the function to accumulate electric charge; the dielectric films formed on surfaces of the particles, having the function to prevent the dispersion of electric charge and having a roughly uniform thickness; and the insulator that covers the plurality of charge retention portions. Therefore, this semiconductor storage element operates as a nonvolatile semiconductor storage element that has a satisfactory charge retention characteristic.

Particularly, the memory function body of the semiconductor storage element has the charge retention portion in which the particles having the function to accumulate electric charge are covered with the dielectric films that have the function to prevent the dispersion of electric charge. Accordingly, there can be provided a semiconductor storage element, which can effectively restrain the leakage of the electric charge accumulated in the particles and has a good charge retention characteristic and long-term reliability. Furthermore, the thickness possessed by the dielectric film is uniform. Therefore, the surface of each particle covered with this dielectric film can be set apart at a roughly uniform distance from the surfaces of the gate electrode and the semiconductor substrate. Accordingly, there can be provided a semiconductor storage element and a semiconductor device, which can restrain the read error due to variations in the size of the particles and have high reliability. It is to be noted that the dielectric film having the roughly uniform thickness may have variation within a range of manufacturing variation.

Moreover, in the case where the memory function body is formed in each of the semiconductor storage element and the semiconductor switching element, there is no significant difference between the manufacturing processes of both of them. Therefore, for example, a semiconductor device, in which the logic circuit that has the semiconductor switching element and the nonvolatile memory that has the semiconductor storage element are consolidated, can be fabricated through a reduced number of processes, and the cost can be reduced.

Furthermore, the semiconductor storage element in which the interval (offset region) is provided between the gate electrode and the source/drain diffusion regions and the semiconductor switching element that has no such interval are consolidated in the gate length direction on the identical substrate. Therefore, the nonvolatile semiconductor storage element of a satisfactory memory characteristic and the semiconductor switching element of a high current drive characteristic can be consolidated.

The conventional flash memory has been able to operate only as an FET whose gate insulator has been a thick-film because the portion (memory film) that has produced the charge storage function has been located below the gate electrode. However, since the memory function body is located on the sides of the gate electrode, the latest MOSFET manufacturing processes can easily be applied to the semiconductor storage element of the present invention. Therefore, according to the present invention, there can easily be provided such a semiconductor device in which the semiconductor storage element and the semiconductor switching element are consolidated. Furthermore, there can easily be provided a semiconductor device provided with the logic circuit region formed by employing a plurality of semiconductor switching elements and the memory region formed by employing a plurality of semiconductor storage elements.

Furthermore, the semiconductor storage element of one embodiment is characterized in that the dielectric film formed on the surface of each particle has a roughly uniform thickness within a range of 1 to 10 nm.

According to the above-mentioned embodiment, by setting the surface of each particle covered with the dielectric film apart at an appropriate distance from the surfaces of the gate electrode and the semiconductor substrate with regard to the charge retention portions, the electric charge injection into the particles can be carried out with satisfactory efficiency while maintaining satisfactory retention (storage retention characteristic). In this case, when the thickness of the dielectric film is smaller than 1 nm, the electric charge accumulated in the particles tends to easily disperse. When the thickness of the dielectric film is greater than 10 nm, the injection efficiency of electric charge into the particles is reduced.

Particularly, when the thickness of the dielectric film is not smaller than 3 nm, the restraint of the dispersion of electric charge due to the direct tunneling of the electric charge accumulated in the particles becomes possible. On the other hand, when the thickness of the dielectric film is not greater than 6 nm, the electric charge can be efficiently moved by tunneling conduction of FN (Fowler Nordheim) tunneling conduction or the like between the particles and the semiconductor substrate and the gate electrode. Accordingly, there can be provided a nonvolatile semiconductor storage element that is able to execute the write/erase operations with a low voltage at high speed and achieve long-term retention.

Furthermore, the semiconductor storage element of one embodiment is characterized in that the particles have a roughly uniform size within a range of 1 to 15 nm, and the dielectric film formed on each of the particles has a roughly uniform thickness within a range of 1 to 5 nm.

According to the above-mentioned embodiment, by making the dielectric film have a roughly uniform thickness within a range of 1 to 5 nm with regard to the charge retention portions, a distance between the surface of each particle and the surface of the semiconductor substrate becomes 1 to 5 nm, and a separation distance between the mutually adjoining particles becomes 2 to 10 nm. With this arrangement, the dispersion of the electric charge accumulated in the particles is effectively prevented, and the retention is improved. Particularly, when the thickness of the dielectric film is not greater than 3 nm, the separation distance between the mutually adjoining particles becomes equal to or smaller than 6 nm. Therefore, the electric charge can be moved by tunneling conduction between these mutually adjoining particles. Accordingly, there can be provided a nonvolatile semiconductor storage element that is able to execute high-speed write/erase with a very low voltage and achieve long-term retention. Moreover, by setting the size of the particles equal to or greater than 1 nm, write efficiency is prevented from being reduced as a consequence of excessive Coulomb blockade effect. Furthermore, by setting the size of the particles equal to or smaller than 15 nm, the energy levels of the particles are appropriately dispersed, and electric charge is retained by the Coulomb blockade effect. Accordingly, there can be provided a nonvolatile memory capable of retaining electric charge for a long time. Particularly, by adjusting the size of the particles and the thickness of the dielectric film, a double tunnel junction is formed between the mutually adjoining particles. Accordingly, there can be provided a nonvolatile memory that produces the Coulomb blockade effect more efficiently and is able to retain electric charge for a longer time. The fact that the thickness of the dielectric films is roughly uniform means that variations within the range of manufacturing variation are tolerated.

Furthermore, the semiconductor storage element of one embodiment is characterized in that the semiconductor substrate is a silicon substrate, and the particles are made of silicon.

According to the above-mentioned embodiment, the very advanced silicon processes can be used by using silicon that is most widely used as the material of an LSI (Large Scale Integrated Circuit), and therefore, manufacturing is facilitated.

Furthermore, the semiconductor storage element of one embodiment is characterized in that the upper end of the particle in the charge retention portion, the particle located upwardly farthest apart from the surface of the semiconductor substrate, is positioned below the uppermost end of the gate electrode.

According to the semiconductor storage element of the above-mentioned construction, the particles in the charge retention portions are arranged in the vicinity of the channel forming region of the semiconductor substrate. Therefore, the electric charge injected during write in the semiconductor storage element is retained in the positions in the vicinity of the channel forming region, and therefore, the electric charge is easily removed during erase. Therefore, an erase error is effectively prevented in this semiconductor storage element. Moreover, by limiting the arrangement positions of the particles that have the charge storage function to a comparatively small region, the charge storage density can be increased. Therefore, a difference between the threshold voltage during write and the threshold voltage during erase as well as a difference in the drive current increase. Therefore, a nonvolatile semiconductor storage element, which has a large voltage margin and satisfactory reliability, can be formed.

In the semiconductor device of one embodiment, the semiconductor switching element has a portion of the source/drain diffusion regions located below the gate electrode having an impurity concentration lower than that in a portion of the source/drain diffusion regions located outside the memory function body in the gate length direction.

According to the above-mentioned embodiment, the source/drain diffusion regions of the switching device is partially located below the gate electrode, and this portion located below the gate electrode has an impurity concentration lower than that of the portion located outside the memory function body in the gate length direction. Therefore, the drain withstand voltage is improved. On the other hand, the source/drain diffusion regions of the semiconductor storage element do not have such a construction. Therefore, hot carriers are efficiently generated, and sufficiently high write/erase speed can be consequently obtained. Therefore, a semiconductor switching element that has high reliability and the semiconductor storage element that has sufficiently high write/erase speed can be formed on an identical semiconductor device.

Furthermore, the semiconductor device of one embodiment is characterized in that the semiconductor switching element of the logic circuit region is driven by a power voltage lower than that of the power voltage for driving the semiconductor storage element of the memory region.

According to the above-mentioned embodiment, the semiconductor storage element of the memory region is supplied with a comparatively high power voltage, and therefore, the write/erase speed is increased. On the other hand, the semiconductor switching element of the logic circuit region is supplied with a comparatively low power voltage. Therefore, the deterioration of the transistor characteristic due to the breakdown of the gate insulator or the like is restrained, by which a further reduction in the power consumption is achieved. Since these devices are consolidated, the semiconductor device can concurrently achieve the improvement in the reliability of the logic circuit formed by employing the semiconductor switching element and the increase in the operation speed of the memory formed by employing the semiconductor storage element.

Furthermore, the semiconductor device of one embodiment is characterized in that a static random access memory is formed on the semiconductor substrate by employing a switching device that has the same construction as that of the semiconductor switching element of the logic circuit region.

According to the above-mentioned embodiment, by employing a semiconductor switching element that has the same construction as that of the semiconductor switching element of the logic circuit region, a static random access memory (hereinafter referred to as an SRAM) can be formed on the semiconductor substrate without adding any further process. That is, a high-performance semiconductor device in which a logic circuit region, a temporary storage type memory region of the SRAM and a nonvolatile memory region of the semiconductor storage element are consolidated on an identical substrate can be formed through a comparatively small number of processes.

Moreover, the IC card of the an embodiment of the present invention is characterized by being provided with the above-mentioned semiconductor device.

According to the IC (Integrated Circuit) card of the above-mentioned construction, there is provided the semiconductor device in which the memory region that has the semiconductor storage element and the logic circuit region that has the semiconductor switching element are arranged. Therefore, a compact IC card in which a nonvolatile memory of high-speed operation is driven by a logic circuit (peripheral circuit) of high reliably and low voltage operation can be constructed. Furthermore, by providing an SRAM formed of a switching device that has the same construction as that of the above-mentioned switching device on the semiconductor substrate of the semiconductor device, an IC card of a higher performance can be provided comparatively easily at low cost.

Moreover, the portable electronic equipment of an embodiment of the present invention is characterized by being provided with the above-mentioned semiconductor device.

According to the portable electronic equipment of the above-mentioned construction, there is provided the semiconductor device in which the memory region that has the semiconductor storage element and the logic circuit region that has the semiconductor switching element are arranged. Therefore, compact portable electronic equipment in which a nonvolatile memory of high-speed operation is driven by a logic circuit (peripheral circuit) of high reliability and low voltage operation can be constructed. Furthermore, by providing an SRAM formed of a switching device that has the same construction as that of the above-mentioned switching device on the semiconductor substrate of the semiconductor device, portable electronic equipment of a higher performance can be provided comparatively easily at low cost.

An embodiment of the present invention provides a semiconductor storage element manufacturing method comprising the steps of:
    forming a gate electrode on a semiconductor substrate via a gate insulator;
    arranging a plurality of charge retention portions constructed of particles having a function to accumulate electric charge and dielectric films formed on surfaces of the particles by oxidizing or oxynitriding a material identical to a material of the particles and having a roughly uniform film thickness;
    depositing an insulator on the semiconductor substrate and on the gate electrode so as to cover the charge retention portions;
    forming a sidewall-shaped memory function body constructed of the charge retention portions and the insulator on side surfaces of the gate electrode by partially removing the charge retention portions and the insulator by anisotropic etching; and
    carrying out impurity implantation for forming source/drain diffusion regions in the semiconductor substrate using the gate electrode and the memory function body as a mask.

According to the semiconductor storage element manufacturing method of the above-mentioned construction, in the charge retention portions, by oxidizing or oxynitriding, for example, the surface portions of the materials that form the particles or in a similar manner, the particles located inside this oxidized or oxynitrided surface portions and the dielectric films on the surfaces of the particles are easily formed. In forming the charge retention portions by oxidizing or oxynitriding the materials that form the particles, a rate of oxidation or oxynitridation becomes smaller as the size of the materials that form the particles is smaller. Therefore, by making the size of the materials that form the particles comparatively small, the thickness of the dielectric films formed by oxidation or oxynitridation and variations in the size of the particles formed inside the dielectric films can be effectively restrained. As a result, read errors attributed to variations in the thickness of the particles and the dielectric films are restrained, so that a semiconductor storage element of high reliability can be obtained.

Moreover, in the semiconductor storage element manufactured by the above-mentioned manufacturing method, the dielectric films of the charge retention portions intervenes between the surfaces of the semiconductor substrate and the gate electrode and the surfaces of the particles in the charge retention portions put in contact with this semiconductor substrate and the gate electrode. In contrast to this, the dielectric films intervene between the particles in mutually adjoining charge retention portions. That is, two dielectric films intervene. Therefore, electric charge injected from the semiconductor substrate into the charge retention portion, which is the charge retention portion being not put in contact with the gate electrode and put in contact with another charge retention portion, hardly penetrates into the gate electrode. Moreover, the injection of electric charge from the substrate into the charge retention portions put in contact with the semiconductor substrate is promoted, and the dispersion of the electric charge accumulated in the particles of the charge retention portions is restrained. Therefore, a semiconductor storage element, which has high write/erase speed and a satisfactory retention characteristic, can be manufactured.

An embodiment of the present invention also provides a semiconductor device manufacturing method for forming a semiconductor switching element constructed of a field-effect transistor in a logic circuit region set on a semiconductor substrate in parallel with forming a semiconductor storage element constructed of a field-effect transistor in a memory region set on the semiconductor substrate, the method comprising the steps of:

forming a gate insulator and a gate electrode on a surface of the semiconductor substrate in each of the memory region and the logic circuit region;

forming a first impurity implantation region that becomes part of source/drain diffusion regions only in the logic circuit region of the semiconductor substrate;

forming a memory function body on opposite sides of the gate electrode at least in the memory region, the memory function body being formed of a plurality of charge retention portions constructed of particles having a function to accumulate electric charge, dielectric films formed on surfaces of the particles, having a function to prevent dispersion of the electric charge and having a roughly uniform film thickness and an insulator covering the plurality of charge retention portions; and forming a second impurity implantation region that becomes at least part of source/drain diffusion regions by implanting an impurity of a conductive type identical to that of an impurity forming the first impurity implantation region into the semiconductor substrate in the memory region and the logic circuit region with use of the gate electrode and the memory function body as a mask.

According to the semiconductor device manufacturing method of the above-mentioned construction, the semiconductor storage element in which the first impurity implantation using, for example, a photoresist as a mask is not carried out and only the second impurity implantation is carried out as well as the semiconductor switching element in which the first and second impurity implantations are carried out are formed in parallel with each other on the identical semiconductor substrate. Through this process, the semiconductor switching element in which the source/drain diffusion regions is at least partially located below the gate electrode and the semiconductor storage element that has the interval between the source/drain diffusion regions and the gate electrode (the source/drain diffusion regions are offset to the gate electrode) in the gate length direction can be consolidated on the semiconductor substrate. Therefore, the semiconductor device in which the logic circuit and the like constructed of the semiconductor switching element and the nonvolatile memory constructed of the semiconductor storage element can easily be manufactured. Furthermore, the semiconductor switching element in which the source/drain diffusion regions are not offset to the gate electrode has a comparatively large drive current, while the semiconductor storage element in which the source/drain diffusion regions are offset to the gate electrode has a comparatively large memory effect. Therefore, a semiconductor device, in which the logic circuit that has a comparatively large drive current and the nonvolatile memory that has a comparatively large memory effect are consolidated, can easily be provided.

Furthermore, according to the above-mentioned semiconductor device manufacturing method, by forming the first impurity implantation region through implantation with, for example, the gate electrode used as a mask in the logic circuit region of the semiconductor substrate, the semiconductor switching element that has the source/drain diffusion regions being not offset to the gate electrode can be simply formed through a self-alignment process. Furthermore, by forming the second impurity implantation region through implantation with the gate electrode and the memory function bodies used as a mask, the semiconductor storage element that has the source/drain diffusion regions being offset to the gate electrode can be simply formed through a self-alignment process. Therefore, the consolidation of the nonvolatile memory of the semiconductor storage element and the logic circuit of the semiconductor switching element can be achieved extremely easily.

Furthermore, the charge retention portions are arranged on the semiconductor substrate in a state in which the surfaces of the particles that accumulate electric charge are preliminarily wrapped in the dielectric films. Therefore, the dimensional uniformity can be improved, and the particles can be further minimized, improving the reliability of the memory. Moreover, the dispersion of the electric charge accumulated in the particles is restrained by the dielectric films. Therefore, a semiconductor storage element of a satisfactory retention characteristic as well as a semiconductor device that is provided with this device and has a satisfactory characteristic can be provided.

In the semiconductor device manufacturing method of one embodiment, the step of forming the memory function body comprises:

arranging a plurality of charge retention portions constructed of particles having a function to accumulate electric charge and dielectric films formed on surfaces of the particles by oxidizing or oxynitriding a material identical to a material of the particles and having a roughly uniform film thickness;

depositing an insulator on the semiconductor substrate and on the gate electrode so as to cover the charge retention portions; and forming a sidewall-shaped memory function body constructed of the charge retention portions and the insulator on side surfaces of the gate electrode by partially removing the charge retention portions and the insulator by anisotropic etching.

According to the semiconductor device manufacturing method of the above-mentioned embodiment, in the charge retention portions, by oxidizing or oxynitriding, for example, the surface portions of the materials that form the particles or in a similar manner, the particles located inside this oxidized or oxynitrided surface portions and the dielectric films on the surfaces of the particles are easily formed. In forming the charge retention portions by oxidizing or oxynitriding the materials that form the particles, a rate of oxidation or oxynitridation becomes smaller as the size of the materials that form the particles is smaller. Therefore, by making the size of the materials that form the particles comparatively small, the thickness of the dielectric films formed by oxidation or oxynitridation and variations in the size of the particles formed inside the dielectric films can be effectively restrained. As a result, read errors attributed to variations in the thickness of the particles and the dielectric films are restrained, so that a semiconductor storage element of high reliability and a semiconductor device provided with this are obtained.

Moreover, in the semiconductor storage element of the semiconductor device manufactured by the above-mentioned manufacturing method, the dielectric films of the charge retention portions intervenes between the surfaces of the semiconductor substrate and the gate electrode and the surfaces of the particles in the charge retention portions put in contact with this semiconductor substrate and the gate electrode. In contrast to this, the dielectric films intervene between the particles in mutually adjoining charge retention portions. That is, two dielectric films intervene. Therefore, electric charge injected from the semiconductor substrate into the charge retention portion, which is the charge retention portion being not put in contact with the gate electrode and put in contact with another charge retention portion, hardly penetrates into the gate electrode. Moreover, the injection of electric charge from the substrate into the charge retention portions put in contact with the semiconductor substrate is promoted, and the dispersion of the electric charge accumulated in the particles of the charge retention portions is restrained. Therefore, a semiconductor storage element, which has high write/erase speed and a satisfactory retention characteristic, and a semiconductor device provided with this can be manufactured.

Moreover, the insulator is deposited on the semiconductor substrate and on the gate electrode so as to cover the charge retention portions, and the insulator and the charge retention portions are partially removed by anisotropic etching. Therefore, the sidewall-shaped memory function bodies can easily be formed on the side surfaces of the gate electrode through a self-alignment process.

The semiconductor device manufacturing method of one embodiment is characterized by including the process of carrying out isotropic etching on the memory function bodies after forming the sidewall-shaped memory function bodies.

According to the semiconductor device manufacturing method of the above-mentioned embodiment, the sidewall-shaped memory function body is further subjected to the isotropic etching. Therefore, the particle located upwardly farthest apart from the surface of the semiconductor substrate among the charge retention portions included in each of the memory function bodies is positioned below the uppermost end of the gate electrode. Therefore, the particles in the charge retention portions can be arranged in the vicinity of the channel forming region formed in the surface portion of the semiconductor substrate. As a result, the electric charge injected during write is retained in the vicinity of the channel, and therefore, the retained electric charge is easily removed during erase. Therefore, an erase error can be effectively prevented. Moreover, by limiting the arrangement positions of the particles that have the charge storage function to a comparatively small region, the charge storage density can be increased. Therefore, a difference between the threshold voltage during write and the threshold voltage during erase as well as a difference in the drive current increase. Therefore, a nonvolatile semiconductor storage element, which has a large voltage margin and satisfactory reliability, and a semiconductor device employing it can be formed.

Moreover, even when a residue is left in the charge retention portions and so on through the etchback process in forming the sidewall-shaped memory function bodies, this residue can be lifted off by the isotropic etching. Therefore, the defect of the device due to the residue can effectively be restrained.

In the semiconductor device manufacturing method of one embodiment, an impurity concentration in the second impurity implantation region is higher than an impurity concentration in the first impurity implantation region.

According to the above-mentioned embodiment, with regard to the semiconductor switching element, the source/drain diffusion regions are formed of the first and second impurity implantation regions, and the portion formed of the first impurity implantation region in the vicinity of the gate electrode comes to have a lower concentration than in the portions other than the portions located in the vicinity of the gate electrode formed of the second impurity implantation region. Accordingly, there can be obtained a semiconductor switching element, in which the source/drain diffusion regions have a satisfactory drain withstand voltage. On the other hand, with regard to the source/drain diffusion regions of the semiconductor storage element, the source/drain diffusion regions are formed only of the second impurity implantation region, and therefore, hot carriers are efficiently generated. Accordingly, there can be obtained a semiconductor storage element, which has sufficiently high write/erase speed. As described above, according to the present embodiment, a semiconductor device, which is provided with the highly reliable semiconductor switching element and the semiconductor storage element that has sufficiently high write/erase speed, can be manufactured.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7A is a plan view showing a surface of a semiconductor substrate in the process of FIG. 6E;

FIG. 7B is a plan view showing a state in which an exposed portion of an L-figured conductor is removed subsequently to the process of FIG. 7A;

DETAILED DESCRIPTION OF THE PREFERRED EMBODIMENTS

Figure 1:
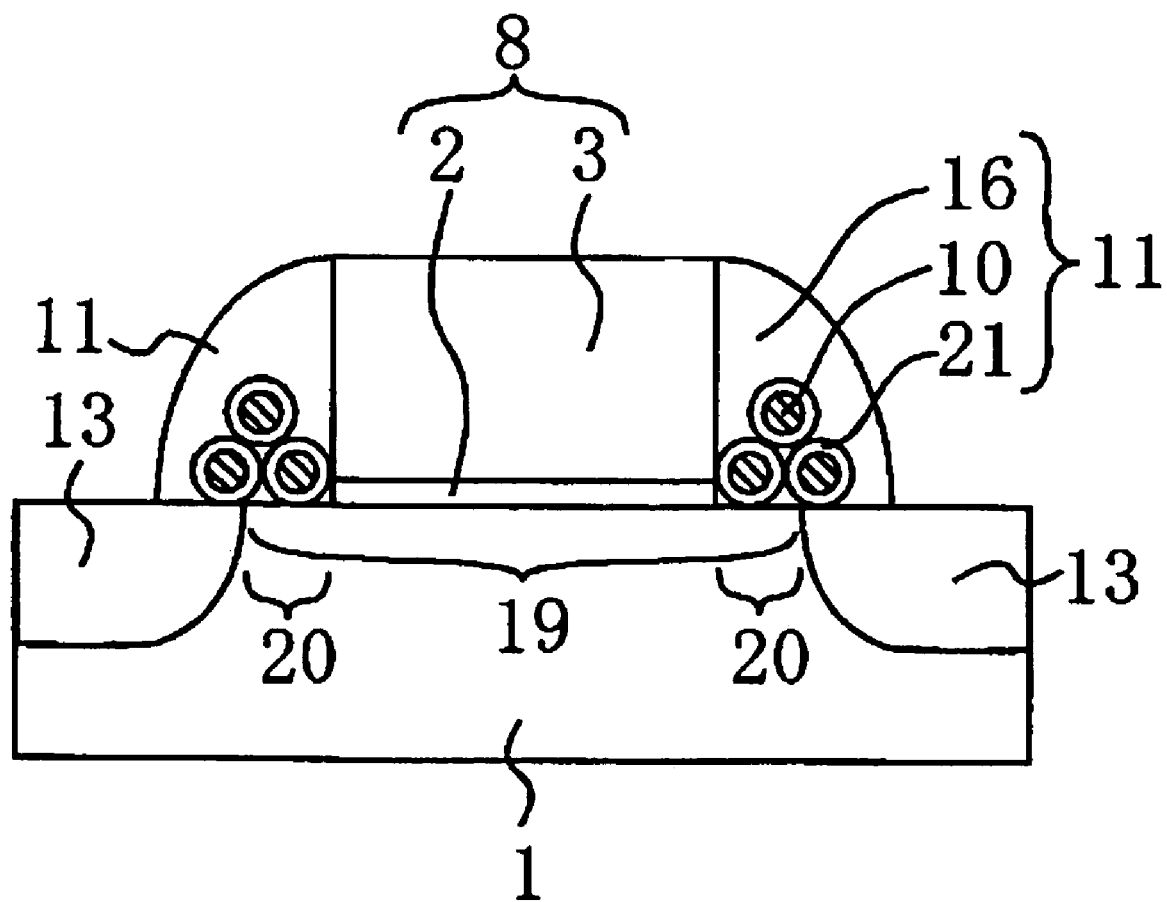
FIG. 1 is a sectional view showing a structure of a semiconductor storage element according to a first embodiment of the present invention.

The present invention will be described in detail below on the basis of embodiments shown in the drawings.

First Embodiment

FIG. 1 is a view showing a semiconductor storage element of a first embodiment of the present invention.

As shown in FIG. 1, in the semiconductor storage element of the present embodiment, a gate electrode 3 is formed via a gate insulator 2 on a semiconductor substrate 1. Memory function bodies 11 are formed on opposite sides of a gate stack 8 constructed of the gate insulator 2 and the gate electrode 3. The memory function body is constructed of a charge retention portion, in which a wrap dielectric film 21 as a dielectric film is formed on the surface of a silicon dot 10 as a particle, and a sidewall insulator 16 as an insulator that covers this charge retention portion. A memory effect is produced by accumulating and retaining electric charge in the silicon dots 10 of the memory function bodies 11. Moreover, source/drain diffusion regions 13, 13 as two impurity diffusion regions are formed below the two memory function bodies 11, 11. The source/drain diffusion regions 13, 13 are offset to the gate electrode 3. That is, the source/drain diffusion regions 13, 13 are located not below the gate electrode 3. Offset regions 20, 20 are formed between the confronting ends of the source/drain diffusion regions 13, 13 and both ends of the gate electrode 3. In other words, a channel forming region 19, which is a region between one end and the other end of the source/drain regions 13, includes the offset regions 20 that are located just under the memory function bodies 11 on both the sides of the gate stack 8. With the above-mentioned arrangement, electrons and holes are efficiently injected into the memory function bodies 11, and thereby write and erase speeds are improved in the semiconductor storage element.

Since the source/drain diffusion regions 13 are offset to the gate electrode 3, 3, invertibility of the offset region 20 is easily and largely changed by the amount of electric charge accumulated in the memory function bodies 11 when a voltage is applied to the gate electrode 3, and thereby the semiconductor storage element makes it possible to increase the memory effect. Furthermore, a short-channel effect is more restrained in comparison with the MOSFET of an ordinary structure, and therefore the gate length can be reduced in scale. Moreover, since this structure is suitable for restraining the short-channel effect, it becomes possible to adopt a gate insulator of a large film thickness and thus improve the reliability in comparison with a logic transistor in which the source/drain regions are not offset to the gate electrode.

Also, the memory function bodies 11 of the semiconductor storage element are located not in the gate insulator position of the FET dissimilarly to the conventional case but formed independently of the gate insulator 2 in the present embodiment. Therefore, the memory function borne by the memory function bodies 11 and the transistor operation function borne by the gate insulator 2 are separated from each other. Moreover, since the memory function bodies 11 are independent of the gate insulator 2, a material suitable for the memory function can be selected for the memory function bodies 11.

Although FIG. 1 shows the boundaries between the sidewall insulator 16 and the wrap dielectric films 21 in which the silicon dots are wrapped, the boundaries may be undistinguished when the wrap dielectric films 21 and the sidewall insulator are made of same material. In the present invention, it is postulated that the surfaces of the particles are covered with the dielectric films even when the provision of the dielectric films on the surfaces of the particles is not described unless it is clearly expressed that the dielectric films do not exist.

In the present embodiment, the constituents of the semiconductor storage element may be changed as follows.

As described above, the semiconductor storage element of the present embodiment is mainly constructed of the gate insulator, the gate electrode formed on the gate insulator, the memory function bodies formed on opposite sides of this gate electrode, the channel forming region formed below the gate electrode, and the source/drain diffusion regions that are formed on opposite sides of this channel forming region and have a conductive type opposite to the conductive type of this channel forming region.

The semiconductor storage element functions as a semiconductor storage element that stores information of four or more values by storing information of two or more values in one memory function body. The semiconductor storage element also functions as a memory cell that concurrently have the functions of a select transistor and a memory transistor by a variable resistor effect of the memory function bodies. However, this semiconductor storage element is not necessarily required to function by storing information of four or more values but allowed to function by storing, for example, information of two values.

The semiconductor storage element of the present embodiment should preferably be formed on the semiconductor substrate or on a well region of the same conductive type as that of the channel forming region formed in the semiconductor substrate.

The semiconductor substrate is not specifically limited so long as it may be used for a semiconductor device. There may be used semiconductor substrates which are of, for example, elemental semiconductors of silicon, germanium and so on and compound semiconductors of silicon germanium, GaAs, InGaAs, ZnSe, GaN and so on. Moreover, as one that has a semiconductor layer on its surface, it is acceptable to employ a variety of substrates of a SOI (Silicon on Insulator) substrate, a multilayer SOI substrate, a glass substrate and a plastic substrate, on which a semiconductor layer is provided. In particular, a silicon substrate or a SOI substrate on the surface of which a silicon layer is formed, is preferable. The semiconductor substrate or the semiconductor layer may be made of any one of single crystal (e.g., epitaxially grown), polycrystal and amorphous although there is a difference in the amount of internal current.

It is preferable that a device isolation region is formed on the surface of the semiconductor substrate or the semiconductor layer, and it is further acceptable that the devices of transistors, capacitors, resistors and so on, circuits and semiconductor devices of these devices or layer insulators are combined and formed with a single or multilayer structure. The device isolation region can be formed by a device isolation film of LOCOS, trench oxide, STI or the like. The semiconductor substrate may have the p-type or n-type conductive type, and at least one p-type or n-type well region should preferably be formed on this semiconductor substrate. With regard to the impurity concentrations of the semiconductor substrate and the well region, the acceptable concentration is within the well-known range. When a SOI substrate is employed as the semiconductor substrate, it is acceptable to form a well region on the surface semiconductor layer or provide a body region under the channel forming region.

The gate insulator is not specifically limited so long as it is generally used for a semiconductor device, and it is acceptable to employ a single layer or a laminate of, for example, a dielectric such as silicon oxide and silicon nitride and a high dielectric such as aluminum oxide, titanium oxide, tantalum oxide and hafnium oxide. In particular, silicon oxide is preferable. The gate insulator should preferably have, for example, an equivalent oxide film thickness of about 1 nm to 20 nm and preferably a film thickness of about 1 nm to 6 nm. The gate insulator may be formed only just under the gate electrode or formed more largely (widely) than the gate electrode.

The gate electrode or an electrode can be formed on the gate insulator in a configuration generally used for a semiconductor device or a configuration that has a recess portion in a lower end portion. The gate electrode means the gate electrode that is integrally formed without being separated by a single-layer or multilayer conductive film. This gate electrode is not specifically limited so long as it is generally used for a semiconductor device and is able to be formed in a single layer or a laminate layer of, for example, polysilicon, a metal such as copper or aluminum, a high melting point metal such as tungsten, titanium or tantalum or a silicide of the high melting point metal. It is proper to form the gate electrode to a film thickness of, for example, about 50 nm to 400 nm. It is to be noted that the channel forming region is formed below the gate electrode.

The memory function body includes a plurality of charge retention portions constructed of dots (particles) of a conductor or semiconductor that has a function to store electric charge and dielectric films that are formed on the surfaces of the dots and have a function to prevent the dispersion of electric charge and further includes an insulator that covers the charge retention portions. The charge retention portions may be arranged dispersedly in the insulator or arranged in the form of one or more layers. The dots have a dot-like material shape and are not necessarily be spherical. The shape may be a deformed sphere or nearly cubic. The size of the dots should preferably be about 1 nm to 50 nm. The dot size should more preferably be about 1 nm to 15 nm such that a quantum effect of Coulomb blockade or the like is produced. As the material, there can be enumerated silicon nitride and silicon or silicate glass, silicon carbide and alumina containing impurities of a phosphorus, boron or the like. There can be further enumerated high dielectric materials of hafnium oxide, zirconium oxide, tantalum oxide and so on, zinc oxide, ferroelectric materials, metals and so on. In particular, a number of levels for trapping electric charge are formed when the memory function body is formed by employing silicon nitride dots, and therefore, a great hysteresis characteristic can be obtained. Furthermore, since the charge retention time is long and the problem of the charge leakage due to the generation of a leakage path does not occur, the retention characteristic becomes satisfactory. Moreover, silicon nitride, which is a material to be standardly used for the LSI processes, is therefore preferable in that the memory function body can be formed comparatively simply at low cost.

The dielectric film formed on the surfaces of the dots should preferably have a roughly uniform thickness within a range of 1 nm to 10 nm. In particular, the dielectric film should preferably have a thickness of not smaller than 3 nm and not greater than 6 nm in that the restraint of the dispersion of the electric charge accumulated in the dot due to direct tunneling becomes possible, and the efficient movement of the electric charge by FN tunneling conduction between the dot, the semiconductor substrate and the gate becomes possible. As the dielectric film, silicon oxide and so on can be enumerated.

The charge retention portions included in the memory function body is arranged on opposite sides of the gate electrode directly or via the dielectric film and also arranged on the semiconductor substrate (well region, body region, source/drain diffusion regions or diffusion region) directly or via the dielectric film (or the gate insulator). The charge retention portions located on opposite sides of the gate electrode should preferably be arranged so as to totally or partially cover the sidewalls of the gate electrode. As an application example, when a recess portion is provided in the side portion at the lower end of the gate electrode, the charge retention portions may also be formed so as to totally or partially embed the recess portion.

The gate electrode should preferably be formed only on the sidewalls of the memory function bodies or not to cover the upper portions of the memory function bodies. With this arrangement, a contact plug can be arranged near the gate electrode, and therefore, the semiconductor storage element can easily be miniaturized. Moreover, a semiconductor storage element having such a simple arrangement is easy to manufacture, and therefore, yield can be improved.

The source/drain diffusion regions have a conductive type opposite to the conductive type of the semiconductor substrate or the well region and are arranged oppositely from the gate electrode with respect to the memory function bodies. The junctions between the source/drain diffusion regions and the portions of the semiconductor substrate or the well region other than the source/drain diffusion regions should preferably have a steep impurity concentration slope. This is because hot electrons and hot holes are efficiently generated at a low voltage, and high-speed operation can be achieved with a lower voltage. The junction depth of the source/drain diffusion regions is not specifically limited but allowed to be properly adjusted according to the performance and so on of the semiconductor storage element desired to be obtained. Although the source/drain diffusion regions may have a junction depth smaller than the film thickness of the semiconductor layer located on the surface when a SOI substrate is employed as the semiconductor substrate, it is preferable that the junction depth is almost equal to the film thickness of the semiconductor layer located on the surface.

The source/drain diffusion regions may be arranged so as to overlap the gate electrode in the gate length direction. Otherwise, it is acceptable to arrange the regions so that the mutually confronting ends of the source/drain diffusion regions coincide with the corresponding ends of the gate electrode or are offset to the corresponding ends of the gate electrode. Particularly, when the regions are offset, part of the memory function bodies and part of the channel forming region are put in contact with each other in the offset regions. Therefore, the invertibility of the channel forming region (portions corresponding to the offset regions) located under the memory function bodies largely changes depending on the amount of charge accumulated in the memory function bodies when a voltage is applied to the gate electrode. Therefore, the memory effect is increased, and the short-channel effect is reduced to an advantage. However, if the amount of offset is excessive, then a drive current between the source and the drain becomes significantly small. Therefore, the amount of offset, i.e., the distance from one gate electrode end to the end of the source/drain diffusion region in the gate length direction should preferably be smaller than the dimension of the region of the memory function body where the charge retention portion exists in the gate length direction. What is particularly important is that at least part of the plurality of charge retention portions in the memory function bodies partially overlaps part of the source/drain diffusion region. This is because the essence of the semiconductor storage element of the present invention is that the storage is rewritten by electric fields intersecting the memory function bodies by a voltage difference between the gate electrode and the source/drain diffusion regions existing only in the sidewall portions of the memory function bodies.

The source/drain diffusion regions may have a portion extended to a height position higher than the upper surface of the channel forming region, i.e., the lower surface of the gate insulator. In this case, it is proper that the source/drain diffusion regions are constituted by laminating a conductive film integrated with the portions of the source/drain diffusion regions on the portions that constitute the source/drain diffusion regions formed in the semiconductor substrate. As the material of the conductive film, there can be enumerated, for example, semiconductors of polysilicon and amorphous silicon, silicide, the aforementioned metals and high melting point metals. Among these, polysilicon is preferable. The above is because polysilicon has an impurity diffusion rate much greater than in the semiconductor substrate, and therefore, it is easy to shallow the junction depth of the source/drain diffusion regions in the semiconductor substrate and restrain the short-channel effect. In this case, at least part of the memory function bodies should preferably be placed between the portions of the source/drain diffusion regions and the gate electrode.

The semiconductor storage element of the present embodiment can be formed by, for example, a method similar to the method for forming the sidewall spacer of a single-layer or a laminate structure on the sidewalls of the gate electrode through the normal semiconductor processes. In concrete, there is a method for forming a single layer or a laminate including a charge retention portion as in the form of a charge retention portion, charge retention portion/dielectric film, dielectric film/charge retention portion, dielectric film/charge retention portion/dielectric film after the formation of a gate electrode or an electrode, carrying out etchback under appropriate conditions and leaving these films in a sidewall spacer configuration. There is another method for forming a dielectric film or a charge retention portion, carrying out etchback under appropriate conditions for the formation of a sidewall spacer configuration, further forming a charge retention portion or a dielectric film and similarly carrying out etchback for the formation of a sidewall spacer configuration. There is another method for coating or depositing an insulator material in which granular particle material is dispersed on a gate electrode and a semiconductor substrate, carrying out etchback under appropriate conditions and leaving the insulator material in a sidewall spacer configuration. There is another method for forming a gate electrode, thereafter forming the single layer or the laminate and carrying out patterning using a mask. There is another method for forming a charge retention portion, charge retention portion/dielectric film, dielectric film/charge retention portion, dielectric film/charge retention portion/dielectric film or the like before the formation of a gate electrode or an electrode, forming an opening in a region that becomes the channel forming region of these films, forming a gate electrode material film on the entire surface of it and patterning this gate electrode material film into a configuration that includes an opening and has a dimension larger than this opening.

When a memory cell array is constructed by arranging the semiconductor storage elements of the present embodiment, the best form of the semiconductor storage element satisfies, for example, the requirement items that (1) the gate electrodes of a plurality of semiconductor storage elements integrally have a word line function, (2) memory function body is formed on opposite sides of the word line, (3) the dots on the surfaces of which the dielectric films are formed, or, in particular, silicon dots retain electric charge in the memory function bodies, (4) the memory function body is constituted of the charge retention portion constructed of the dielectric films and dots and the insulator, and some of the charge retention portions are arranged roughly parallel to the surface of the gate insulator, (5) the charge retention portions in the memory function bodies are isolated from the word line and the channel forming region with interposition of silicon oxide, (6) the charge retention portions inside the memory function body and the diffusion layer overlap each other, (7) a surface roughly parallel to the surface of the gate insulator is possessed, and the thickness of the dielectric film that isolates the charge retention portions from the channel forming region or the semiconductor layer is different from the thickness of the gate insulator, (8) the write and erase operations of one semiconductor storage element are executed by one word line, (9) there is no electrode (word line) that has a function to assist the write and erase operations on the memory function body, and (10) a region, in which an impurity of the conductive type opposite to the conductive type of this diffusion region is implanted in comparatively high concentration, is provided in a portion that is located just under the memory function body and put in contact with the diffusion region. Although the best form satisfies all of the aforementioned requirement items, it is, of course, not required to satisfy all of the aforementioned requirement items.

When a plurality of the items of the aforementioned requirement are satisfied, there exists a particularly preferable combination. The requirement items are, for example, (3) the dots on the surfaces of which the dielectric films are formed, or, in particular, silicon dots retain electric charge in the memory function body, (9) there is no electrode (word line) that has a function to assist the write and erase operations on the memory function body, and (6) the charge retention portion inside the memory function body and the diffusion layer overlap each other. In this case, it was discovered that the write operation was satisfactorily carried out only when the charge retention portion inside the memory function body and the diffusion layer overlapped each other in the case where the charge retention portion having no conductor retained electric charge in the memory function body and no word line or the like existed on the memory function body. That is, when the requirement items (3) and (9) are satisfied, it is especially preferable to satisfy the requirement item (6). On the other hand, the write operation was able to be carried out even when the dots in the memory function body and the diffusion layer did not overlap each other in the case where the dots constructed of a conductor retained electric charge in the memory function body and there was an electrode that had the function to assist the write and erase operations on the memory function body. However, in the case where the charge retention portion having no conductor retain electric charge in the memory function body and there was no electrode that had the function to assist the write and erase operations on the memory function body, the following very great effects can be obtained. That is, a contact plug can be arranged closer to the memory function body, and storage information can be retained even if the distance between the semiconductor storage elements becomes reduced and a plurality of memory function bodies interfere with one another. This therefore facilitates the miniaturization of the semiconductor storage element. Moreover, because the device structure is simple, the number of processes is reduced, and the yield is improved, allowing the consolidation with the transistors that constitute a logic circuit and an analog circuit to be facilitated. Furthermore, it was confirmed that the write and erase operations were carried out with a low voltage of not higher than 5 V. For the above reasons, it is especially preferable to satisfy the requirement items (3), (9) and (6).

The semiconductor device obtained by combining the semiconductor storage element of the present embodiment with a logic device can be used for battery-drive portable electronic equipment and for, in particular, a portable information terminal. As the portable electronic equipment, there can be enumerated a portable telephone and a game machine besides the portable information terminal.

It is needless to say that the present invention is not limited to the embodiments stated in the present specification.

Moreover, although the n-channel type devices are described in connection with the embodiments, p-channel type devices are also acceptable. In the above case, similar effects are produced by inverting the conductive types of all the impurities and applying voltages with their polarities inverted in operation.

Although the portions that use the same materials and substances are denoted by the same reference numerals in the drawings, the same reference numerals do not always denote same configurations.

It is to be noted that the drawings are schematic, and relations between thickness and planar dimensions, ratios in thickness and size between the layers and portions and so on are different from those of the actual ones. Therefore, the dimensions of concrete thickness and size should be determined in consideration of the following description. Moreover, it is a matter of course that the figures include portions of which the mutual dimensional relations and ratios are different.

The thickness and the size of each layer and each portion described in the present specification are the dimensions of the final configurations in the stage in which the formation of the semiconductor device is completed unless otherwise explained. Therefore, it is to be noted that the dimensions of the final configurations may be somewhat changed by a thermal history and so on in the subsequent processes in comparison with the dimensions immediately after the formation of films, impurity regions and so on.

Second Embodiment

FIGS. 2A through 2D are views showing manufacturing processes of a semiconductor storage element of a second embodiment of the present invention.

Figure 2A:
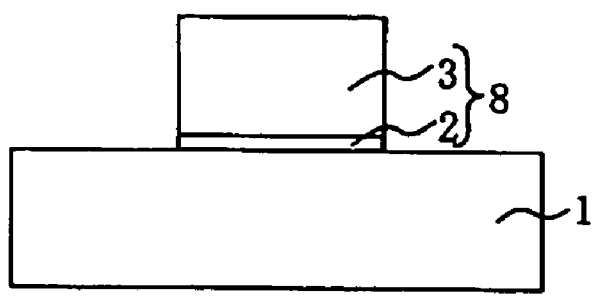
FIGS. 2A through 2D are sectional views showing manufacturing processes of a semiconductor storage element according to a second embodiment of the present invention.

First of all, as shown in FIG. 2A, the manufacturing method of the semiconductor storage element of the present embodiment forms a gate stack 8 constituted of a gate insulator 2 constructed of silicon oxynitride having a film thickness of about 1 nm to 6 nm and a gate electrode 3 constructed of polysilicon having a film thickness of about 50 nm to 400 nm on a semiconductor substrate 1.

Typical formation processes of the gate stack 8 will be described in detail below.

First of all, a device isolation region is formed on the semiconductor substrate 1 that has a p-type semiconductor region by a well-known method. By virtue of this device isolation region, a leakage current can be prevented from flowing between mutually adjoining devices through the substrate. However, such a device isolation region is not required to be formed between devices that share source/drain diffusion regions even between mutually adjoining devices. The aforementioned well-known method for forming the device isolation region can be provided by a method using well-known ROCOS oxide, a method using a well-known trench isolation region or another well-known method so long as the method can achieve the purpose to isolate elements. It is to be noted that the device isolation region is not shown in the figures.

Next, a dielectric film is formed on the entire exposed surface of the semiconductor region. This dielectric film become a portion that serves to operate as the gate insulator of a MOSFET, and therefore, it is desired to form a film of a good quality as the gate insulator by using a process including $N_2O$ oxidation, NO oxidation and a nitriding process after oxidation and so on. The film having a good quality as a gate insulator means a film that is able to restrain all sorts of disadvantageous factors in promoting the miniaturization and performance improvement of the MOSFET by restraining the short-channel effect of the MOSFET, restraining the leakage current that is the current unnecessarily flowing through the gate insulator, restraining the diffusion of gate electrode impurities into the channel forming region of the MOSFET while restraining the depletion of impurities in the gate electrode or pursuing other purposes. As a representative film, there can be enumerated thermal oxide, $N_2O$ oxide and NO oxide, and it is appropriate for these oxides to have a film thickness within a range of 1 nm to 6 nm.

Next, a gate electrode material is formed on the insulator. As the gate electrode material, any material such as a semiconductor of polysilicon, doped polysilicon or the like, a metal of Al, Ti, W or the like or a compound or the like of these metals and silicon can be employed so long as the material has a quality as a MOSFET.

Next, by forming the desired photoresist pattern through a photolithography process on the gate electrode material, carrying out etching with the photoresist pattern used as a mask and etching the gate electrode material and the dielectric film, a structure as shown in FIG. 2A is formed. Although not shown, the dielectric film is not required to be etched at this time. The dielectric film material can be used as a protection film at the time of impurity implantation in the next process when the dielectric film is not etched, and therefore, a process for independently forming a protection film for implantation can be eliminated.

The gate stack may be formed by the method described as follows. A dielectric film similar to the dielectric film is formed on the entire exposed surface of the semiconductor substrate 1 that has a p-type semiconductor region. Next, a gate electrode material similar to the aforementioned gate electrode material is formed on this dielectric film. Next, a mask dielectric film of oxide, nitride, oxynitride or the like is formed on this gate electrode material. Next, a photoresist pattern is formed on the mask dielectric film, and the mask dielectric film is etched. Next, the photoresist pattern is removed, and the gate electrode material is etched with the mask dielectric film used as an etching mask. Subsequently, by etching the mask dielectric film and the exposed portion of the dielectric film, a gate stack 8 as shown in FIG. 2A is formed. Although not shown, the dielectric film on the semiconductor substrate 1 is not required to be etched at this time. The above is because a process for independently forming a protection film for implantation can be eliminated by utilizing the dielectric film as a protection film at the time of impurity implantation in the next process.

It is proper to employ a material used in a logic process conforming to the contemporary scaling rule for the materials of the gate insulator 2 and the gate electrode 3, and the materials are not limited to the aforementioned materials.

Figure 2B:
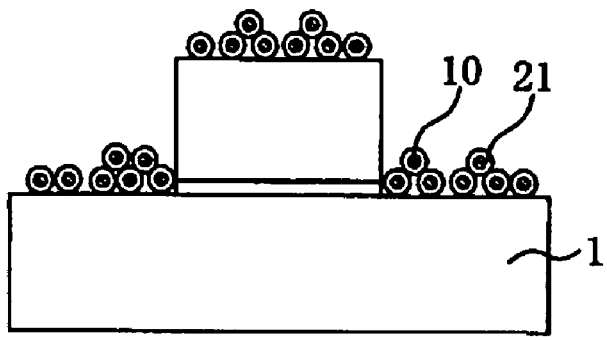

Next, as shown in FIG. 2B, silicon dots 10 whose surfaces are oxidized, i.e., silicon dots 10 wrapped in wrap dielectric films 21 are deposited on the exposed surfaces of the semiconductor substrate 1 and the gate stack 8. This process is carried out by using an aerosol method. That is, the following processes are used. By generating a silicon aerosol in a diluted silane gas atmosphere in a high-temperature furnace at a temperature of 950° C. and oxidizing this aerosol at a high temperature of 1000° C., oxide is formed on the surface, forming the silicon dots 10 and the wrap dielectric films 21 that are the surface oxide of the dots. In this stage, the oxidation rate is made slower as the silicon dot size is made smaller, and therefore, variations in the size of the silicon dots is restrained. Subsequently, the silicon dots 10 and the wrap dielectric films 21 are deposited. According to this method, variations in the size of the silicon dots 10 is restrained, and the crystals of the silicon dots do not directly adhere to one another. Therefore, the silicon dots 10 are formed with good controllability. The silicon dots 10 should preferably have a size of about 1 nm to 50 nm at this time. It is more preferable that the size is within a range of about 1 nm to 15 nm, in which a quantum effect such as the Coulomb blockade effect is produced. Moreover, the surface oxide of the silicon dots, which become a dielectric film through which electrons pass, should be a film of high reliability with a high withstand voltage and a small leakage current. Therefore, the film should preferably be formed of $N_2O$ oxide, NO oxide or the like. In this case, it is proper to that the dielectric films have a film thickness of about 1 nm to 20 nm. When the silicon dot size is about 1 nm to 15 nm, the dielectric film should more preferably have a film thickness of about 1 nm to 10 nm. Further, by forming the dielectric film thin to the extent that a tunneling current flows, the voltage required for the electric charge injection and erase can be lowered, and this allows a low power consumption to be achieved. A typical film thickness in this case is about 1 nm to 3 nm. Although the silicon dots 10 and the wrap dielectric films 21 are deposited unevenly without being aligned in height on the exposed surfaces of the gate stack 8 and the semiconductor substrate 1 in FIG. 2B, it is acceptable to deposit them with the height aligned so as to form one layer. It is also acceptable to form a layer structure of two or more layers.

Figure 2C:
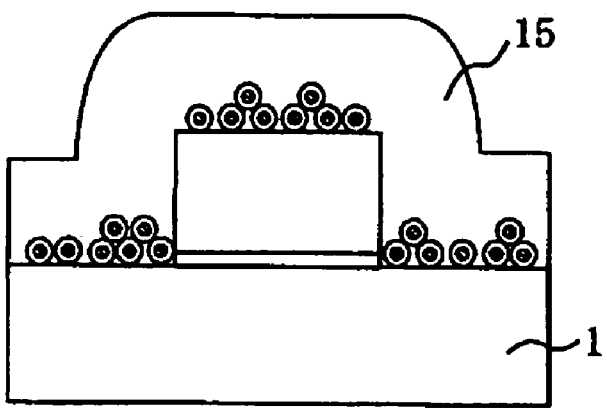

Next, as shown in FIG. 2C, a deposit dielectric film 15, which has a roughly uniform film thickness within a range of about 20 nm to 100 nm, is formed on the exposed surfaces of the gate stack 8, the wrap dielectric films 21 and the semiconductor substrate. It is proper to employ a film that has good step coverage by using CVD (Chemical Vapor Deposition) such as HTO (High Temperature Oxide) as a formation method.

Figure 2D:
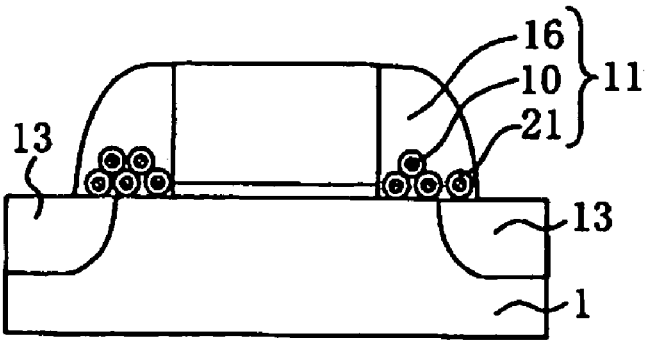

Next, as shown in FIG. 2D, the memory function body 11 constructed of the sidewall insulator 16, the silicon dots 10 and the wrap dielectric films 21 are formed in a spacer configuration on the sidewalls of the gate stack 8 by anisotropically etching the deposit dielectric film 15. This anisotropic etching can selectively etch the deposit dielectric film 15, the wrap dielectric films 21 and the silicon dots 10 and is carried out on a condition of a large etching selection ratio with respect to the semiconductor substrate 1 and the gate electrode 3. However, it is often the case where the semiconductor substrate 1 and the gate electrode 3 normally use silicon materials, and accordingly, there is a problem that the silicon dots remain unetched and become residues during the anisotropic etching. As a countermeasure against this problem, it is proper to remove the residues by carrying out processing with hydrofluoric acid after the anisotropic etching, isotropically etching the oxide and lifting off the silicon dots. In this case, it is proper to reduce the anisotropic etching rate in consideration of the isotropic etching rate of the oxide. If the silicon residues cannot be removed through one-time hydrofluoric acid processing, it is proper to carry out oxidation processing to the extent that the residues are partially oxidized once again and thereafter carry out the hydrofluoric acid processing to effect the liftoff.

Subsequently, by carrying out the implantation into the source and drain using the gate electrode 3 and the memory function body 11 as a mask and thereafter carrying out well-known heat treatment, the source/drain diffusion regions 13 are formed in a self-alignment manner.

In the semiconductor storage element formed through the aforementioned processes, the channel forming region 19 is partially intensely influenced by electric charge when the electric charge is retained in the memory function body 11, and therefore, the drain current value changes. By distinguishing the presence or absence of electric charge on the basis of this change in the drain current value, the function of the storage device can be obtained.

Moreover, by separately arranging the gate insulator 2 and the memory function body 11, a memory cell transistor can be concurrently formed through the same manufacturing processes as those of an ordinary logic transistor. Therefore, the memory peripheral circuit and the memory circuit can be consolidated through very simple processes.

According to the semiconductor storage element of the present embodiment, the short-channel effect is largely restrained while achieving the storage of two bits per transistor, and this allows miniaturization to be achieved. Moreover, high-speed operation and low power consumption can be achieved.

Moreover, in the memory function body 11, the silicon dots 10 that accumulate electric charge are put in contact with the semiconductor substrate 1 and the gate electrode 3 via the wrap dielectric films 21. Therefore, the leakage of the retention electric charge can be restrained by the wrap dielectric films 21. Therefore, a semiconductor storage element, which has a good charge retention characteristic and long-term reliability, is formed.

As described above, the process of forming the semiconductor storage element has a very high affinity for the process of forming the MOSFET of an ordinary structure. As is apparent from FIG. 2D, the construction of the semiconductor storage element has a close resemblance to the well-known general MOSFET. In order to change this general MOSFET into the semiconductor storage element, it is only required to use, for example, a material that has the function of the memory function body for the sidewall spacer of the well-known general MOSFET and remove the LDD (Lightly Doped Drain) region. A semiconductor switching element, which constitutes a memory peripheral circuit and a logic circuit (hereinafter referred to as a logic circuit or the like) does not impair the transistor performance so long as the width of the sidewall spacer is appropriate and the device is operated within a voltage range in which no influential rewrite operation occurs even if the sidewall spacer has the function of the memory function body. Therefore, this semiconductor switching element and the semiconductor storage element can employ a common sidewall spacer.

Moreover, in order to consolidate the semiconductor switching element that constitutes the logic circuit or the like and the semiconductor storage element, it is further required to form an LDD structure only in the semiconductor switching element. In order to form the LDD structure, it is proper to carry out the impurity implantation for the formation of the LDD region after forming the gate electrode and before constructing the memory function bodies. Therefore, merely by masking only the memory region where the semiconductor storage element is formed with a photoresist when the impurity implantation for the formation of this LDD is carried out, the consolidation of the semiconductor storage element and the semiconductor switching element can easily be achieved. Furthermore, by constituting an SRAM of the semiconductor switching element in addition to the semiconductor storage element, it is also possible to easily consolidate the nonvolatile memory, the logic circuit and the SRAM.

According to the semiconductor storage element manufactured in the present embodiment, the storage of two bits per transistor can be achieved. In this case, an example of the method for write, erase and read for achieving the two-bit storage is described below. In this case, reference is made to the case where the memory device is the n-channel type. When the memory device is a p-channel type, it is proper to invert the polarities of all the voltages and similarly apply the resulting voltages. It is proper to apply the ground potential to the nodes (sources, drains, gates and substrate) that are not particularly specified.

When executing write in the semiconductor storage element, a positive voltage is applied to the gate electrode 3, and a positive voltage at the same level as or greater than that of the gate electrode 3 is applied to the drain. At this time, electric charge (electrons) supplied from the source is accelerated in the vicinity of the drain end and becomes hot electrons to be injected into the memory function body 11 located on the drain side. At this time, no electron is injected into the memory function body 11 located on the source side. In the above-mentioned manner, write can be executed in the prescribed memory function body 11 of the two. Moreover, write can be executed in the other memory function body 11 by interchanging the source with the drain, and consequently, two-bit write can easily be achieved.

In order to erase the information written in the semiconductor storage element, hot hole injection is utilized. That is, a positive voltage is applied to the diffusion layer region 13 located on the memory function body 11 side desired to erase the information, and a negative voltage is applied to the gate electrode 3. At this time, positive holes are generated by band-to-band tunneling at the PN junction between the semiconductor substrate 1 and the diffusion layer region 13 to which the positive voltage is applied, attracted to the gate electrode 3 that has a negative potential and then injected into the memory function body 11 desired to be subjected to the erase. The information in the memory function body 11 located on the prescribed side can be thus erased. In order to erase the information written in the memory function body 11 located on the opposite side, it is proper to apply a positive voltage to the memory function body 11 located on the opposite side.

Next, in order to read the information written in the semiconductor storage element, the diffusion region 13 located on the memory function body 11 side desired to be subjected to read is served as the source, and the diffusion region 13 located on the opposite side is served as the drain. That is, it is proper to apply a positive voltage to the gate electrode 3 and apply a positive voltage at the same level as or higher than that of the gate electrode 3 to the drain (diffusion region located on the side that has been used as the source at the time of write). It is to be noted that the voltage at this time is required to be sufficiently reduced so that no write is executed. Since the drain current changes depending on the amount of electric charge accumulated in the memory function body 11, the storage information can be detected by detecting this drain current value. In order to read the information written in the memory function body 11 located on the opposite side, it is proper to interchange the source with the drain.

The methods of write, erase and read are the examples when nitride is employed for the memory function body 11, and other methods can be used. Moreover, even when a material other than nitride is employed for the memory function body 11, the aforementioned methods can be used, and other methods can also be used.

Furthermore, in the semiconductor storage element, the memory function body 11 are arranged not below the gate electrode 3 but on opposite sides of the gate electrode 3, and therefore, the gate insulator 2 is not required to function as a memory function body. That is, the gate insulator 2 can be separated from the memory function body and used so as to simply produce only the function of the gate insulator, and therefore, a design conforming to the LSI scaling rule can be achieved. More in detail, a floating gate is not required to be inserted between the channel and the control gate as in the flash memory, and an ONO film that has a memory function as a gate insulator is not required to be adopted. Therefore, a gate insulator according to miniaturization can be adopted. With this arrangement, the influence of the electric field of the gate electrode exerted on the channel is strengthened, and therefore, a semiconductor storage element that has a memory function resistive to the short-channel effect can be provided. Accordingly, there can be provided a semiconductor storage element, which can improve the degree of integration by miniaturization and is inexpensive. Furthermore, the gate insulator of the semiconductor switching element of the concurrently formed logic circuit can also adopt a gate insulator corresponding to the miniaturization similarly to the semiconductor storage element. Therefore, a semiconductor storage element resistive to the short-channel effect is formed. As described above, the high-performance semiconductor storage element and the semiconductor switching element of the logic circuit or the like can be formed through simple processes in a self-alignment manner.

Furthermore, the memory function bodies of the semiconductor storage element have the charge retention portions in which the silicon dots 10 are wrapped in the wrap dielectric films 21. Therefore, a satisfactory charge retention characteristic can be obtained, and a semiconductor storage element with high reliability can be obtained. More in detail, when the wrap dielectric films 21 are made to have a uniform film thickness within the range of 1 nm to 10 nm, the distance, between which the silicon dots 10 are separated from the semiconductor substrate 1 or the gate electrode 3, becomes equal to or greater than 1 nm. Therefore, the leakage of the electric charge accumulated in the silicon dots 10 toward the semiconductor substrate 1 and the gate electrode 3 is effectively prevented, and retention is improved. Moreover, the distance, between which the silicon dots 10 are separated from the semiconductor substrate 1, is not greater than 10 nm, and therefore, electric charge can be efficiently injected into the silicon dots 10. Particularly, when the thickness of the wrap dielectric film 21 is not smaller than 3 nm, the dispersion of electric charge due to direct tunneling can be restrained. When the thickness of the wrap dielectric film 21 is not greater than 6 nm, electric charge can be efficiently moved by tunneling conduction such as FN tunneling conduction between the semiconductor substrate 1 and the silicon dots 10 and between the gate electrode 3 and the silicon dots 10. Accordingly, there can be provided a nonvolatile semiconductor storage element capable of executing high-speed write and erase with a low voltage and retaining the electric charge for a long term.

Furthermore, when the distance between the semiconductor substrate 1 and the silicon dots 10 is uniform ranging from about 1 to 6 nm and further the distance between a silicon dot 10 and a silicon dot 10 is uniform ranging from about 1 to 6 nm, the dispersion of electric charge can be effectively prevented, and the retention can be improved. Moreover, electric charge can be moved by tunneling conduction between the semiconductor substrate 1 and the silicon dots 10 and between a silicon dot 10 and a silicon dot 10. Therefore, high-speed write and erase can be achieved with a very low voltage, and long-term retention can further be achieved. Moreover, since the size of the silicon dots 10 is not smaller than 1 nm, a reduction in the write efficiency occurring when the Coulomb blockade effect is excessively large is effectively restrained.

Moreover, when the size of the silicon dots 10 is not larger than 15 nm, the energy levels of the silicon dots 10 become dispersed, and electric charge can be retained by the Coulomb blockade effect. Accordingly, there can be provided a nonvolatile semiconductor storage element capable of retaining electric charge for a long time.

Furthermore, the interval between the semiconductor substrate 1 and the silicon dots 10 is uniform ranging from about 1 to 6 nm, the interval between a silicon dot 10 and a silicon dot 10 is uniform ranging from about 1 to 6 nm, and the size of the silicon dots 10 is not larger than 15 nm, a double tunnel junction is formed. Accordingly, there can be provided a semiconductor storage element, in which the Coulomb blockade effect is produced more efficiently and is able to retain electric charge for a longer time.

Third Embodiment

Figure 3A:
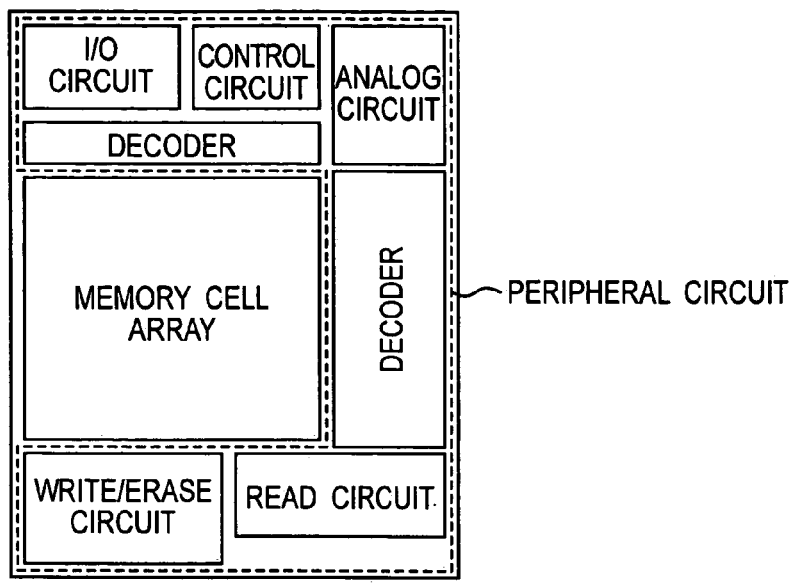
FIGS. 3A and 3B are views showing a semiconductor device according to a third embodiment of the present invention.
Figure 3B:
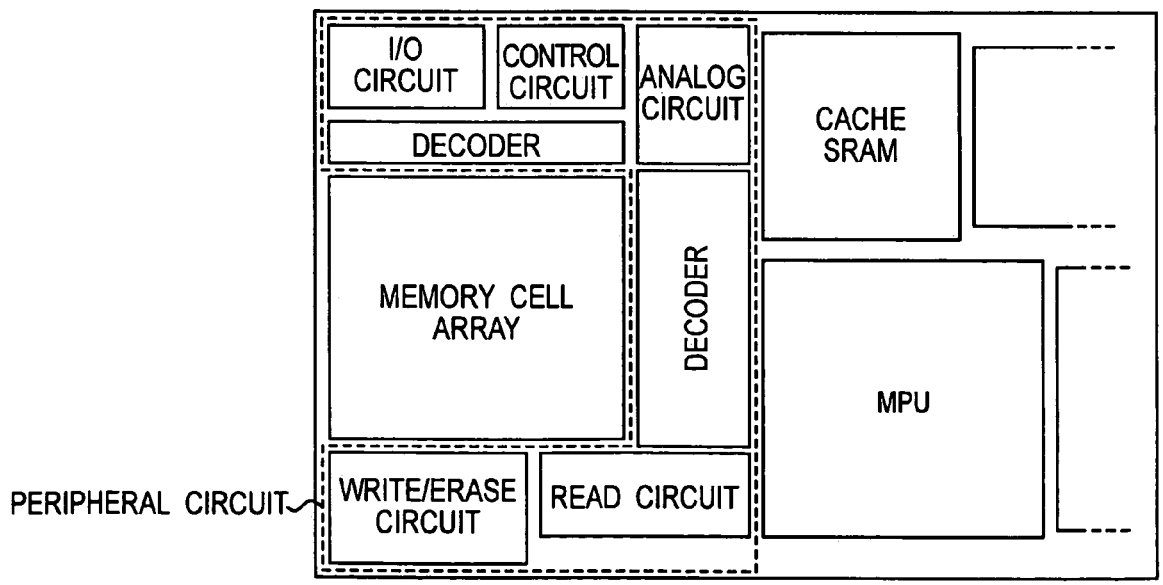

A semiconductor device of a third embodiment of the present invention is constituted by consolidating a semiconductor storage element and a semiconductor switching element. As shown in FIGS. 3A and 3B, in the semiconductor device of an embodiment of the present embodiment, a memory region that has the semiconductor storage element and a logic circuit region that has the semiconductor switching element are consolidated, forming a semiconductor integrated circuit. In the logic circuit region, a memory peripheral circuit provided with the semiconductor switching element that has the normal MOSFET structure, an MPU (Micro Processing Unit) and an SRAM or the like (hereinafter referred to as a logic circuit or the like) are formed.

More in detail, as shown in FIG. 3A, in order to make the semiconductor storage element function as a memory unit of a RAM (Random Access Memory) or the like, a memory cell array, in which the semiconductor storage elements are formed in an array form in the memory region, is arranged in the memory region. Then, the peripheral circuit formed of the semiconductor switching element is arranged in the logic circuit region at the periphery of the memory region. As this peripheral circuit, there can be enumerated circuits such as a decoder, a write/erase circuit, a read circuit, an analog circuit, a control circuit and various I/O circuits, which can be constructed of an ordinary MOS logic circuit.

Further, when the memory unit of a RAM or the like formed of the semiconductor storage element of an embodiment of the present invention is made to function as a storage unit for an information processing system of a personal computer, a portable telephone or the like, as shown in FIG. 3B, it is required to arrange logic circuit regions of an MPU (Micro Processing Unit), a cache of an SRAM, a logic circuit an analog circuit and so on in addition to the memory unit.

According to the semiconductor device of an embodiment of the present embodiment, the memory region is formed of the semiconductor storage element of an embodiment of the present invention, and the logic circuit is formed of the semiconductor switching element of an embodiment of the present invention. Therefore, the manufacturing cost can be remarkably reduced in comparison with the case where the standard CMOS has been formed in order to consolidate the memory region formed of an EEPROM (Electrically Erasable Programmable ROM) of the conventional flash memory or the like and the logic circuit region.

The manufacturing process of the semiconductor device of the present embodiment for forming the logic circuit region formed of the semiconductor switching element and the memory region formed of the semiconductor storage element on an identical semiconductor substrate will be described below. Since the semiconductor storage element of the memory region has the memory function bodies on the sidewalls of the gate stack, the consolidation process becomes very simple. More concretely, by adding a photolithography process to the process after the formation of the gate electrode and separating a region where an LDD diffusion region is formed from a region where the LDD diffusion region is not formed, the logic circuit region and the memory region can be simply fabricated on an identical substrate.

Figure 4A:
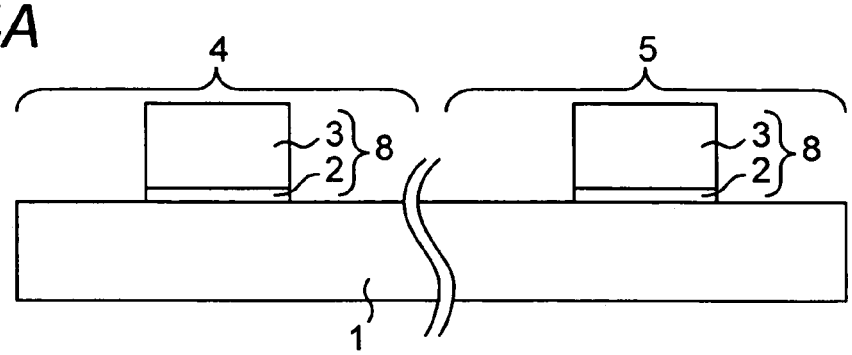
FIGS. 4A through 4D are sectional views showing manufacturing processes of a semiconductor device according to the third embodiment.

First of all, as shown in FIG. 4A, by forming a gate insulator 2 constructed of silicon oxynitride of a film thickness of about 1 nm to 6 nm and a material film for forming a gate electrode 3 of a film thickness of about 50 nm to 400 nm on a semiconductor substrate 1 and patterning these into the desired configurations, a gate stack 8 is formed.

As a material film for the formation of the gate electrode 3, there can be enumerated polysilicon or a laminate of polysilicon and a high melting point metal silicide or a laminate of polysilicon and metal. As described above, it is proper to employ a material used in a logic process conforming to the contemporary scaling rule for the materials of the gate insulator 2 and the gate electrode 3, and the materials are not limited to the above-mentioned materials.

Figure 4B:
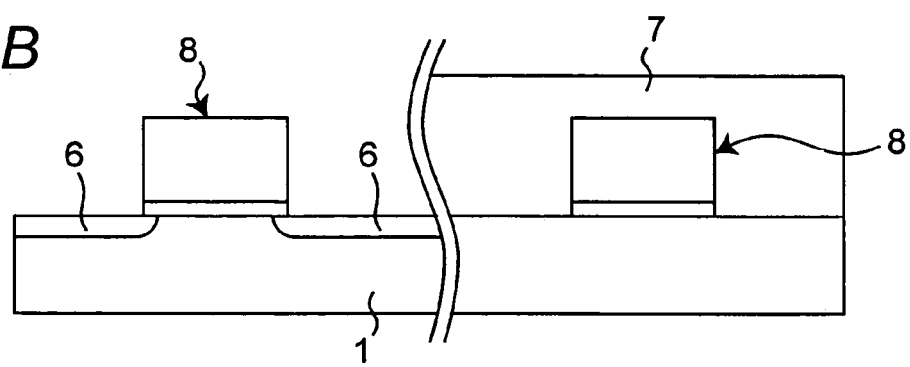

Next, as shown in FIG. 4B, a photoresist is coated to cover the memory region 5 with a photoresist 7, and patterning is carried out so as to provide a resist opening portion in a portion where a semiconductor switching element 32 is to be formed in a logic circuit region 4 (the left half of FIG. 4B corresponds to the resist opening portion). Subsequently, an impurity is implanted with the photoresist 7 and the gate stack 8 used as a mask, forming LDD regions 6 on the surface of the semiconductor substrate corresponding to opposite sides of the gate stack 8. In this case, the LDD regions 6 were not formed in a memory region 5, but the LDD regions 6 were able to be formed in the logic circuit region 4 where a transistor of an ordinary structure is to be formed.

Figure 4C:
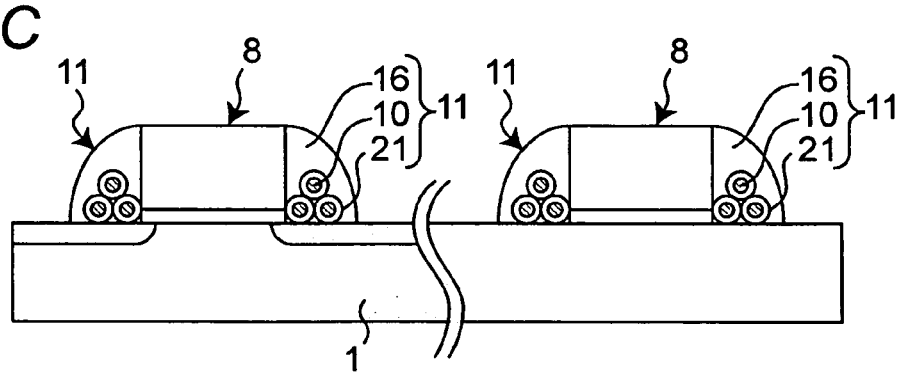

Subsequently, as shown in FIG. 4C, by forming a dielectric film, which includes one or more charge retention portions constructed of particles and wrap dielectric films and has a film thickness of about 20 nm to 100 nm, on the exposed surfaces of the obtained semiconductor substrate 1 and gate stack 8 and carrying out etchback by anisotropic etching, the memory function bodies 11 optimum for storage are formed along the side surfaces of the gate electrode 3.

The memory function bodies 11 are constructed of the charge retention portions in which the wrap dielectric films 21 are formed on the surfaces of the silicon dots 10 as the particles and a sidewall insulator 16 as an insulator that covers the charge retention portions similarly to the memory function bodies 11 of the semiconductor storage element of the first embodiment.

Figure 4D:
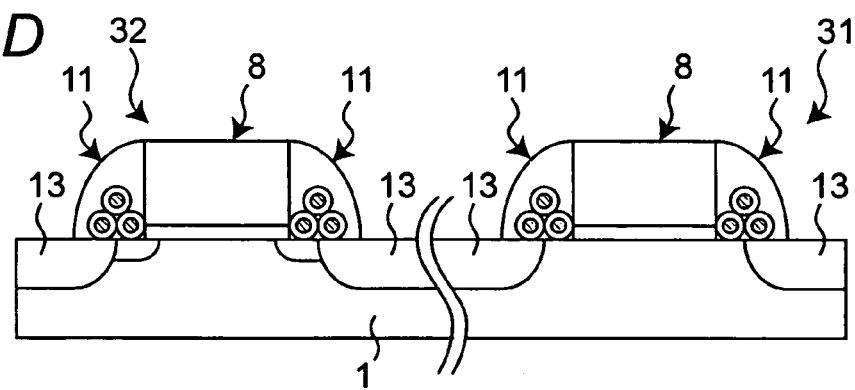

By forming the memory function bodies 11 along the side surfaces of the gate electrode 3 and thereafter implanting impurity ions with the gate electrode 3 and the memory function bodies 11 used as a mask as shown in FIG. 4D, the source/drain diffusion regions 13 are formed on the surface of the semiconductor substrate located on opposite sides of the gate electrode 3 and the memory function bodies 11.

Through the aforementioned processes, the semiconductor storage element 31 and the semiconductor switching element 32 can be formed in parallel with each other on the identical substrate 1.

As is apparent from the above-mentioned processes, the procedure for forming the semiconductor storage element 31 has a high affinity for the formation processes of the MOSFET of an ordinary structure. The construction of the semiconductor storage element 31 has a close resemblance to the well-known general MOSFET. Therefore, in order to alter such a MOSFET into the semiconductor storage element 31, it is merely required to form no LDD region 6 by using, for example, a material that has the function of the memory function bodies 11 for the sidewall spacers of the MOSFET. Even if the sidewall spacers of the MOSFET that constitutes the peripheral circuit, MPU, SRAM and so on to be formed in the logic circuit region 4 has the function of the memory function bodies 11, this sidewall spacer width is appropriate. Therefore, the transistor performance is not impaired so long as the transistor is operated with a voltage within a range in which no rewrite operation occurs. Therefore, a common sidewall spacer (memory function bodies of the present invention) can be used for the semiconductor switching element 32 and the semiconductor storage element 31. Moreover, it is further required to form the LDD structure only in the switching device 32 in order to consolidate the semiconductor switching element 32 that constitutes the peripheral circuit, MPU, SRAM and so on with the semiconductor storage element 31. In order to form the LDD structure, it is proper to carry out impurity implantation for forming the LDD region after the formation of the gate electrode 3 and before the deposition of the material that constitutes the memory function bodies 11. Therefore, merely by masking only the memory region only 5 with the photoresist 7 in carrying out the impurity implantation for the formation of the LDD region, the semiconductor storage element 31 that constitutes the nonvolatile memory and the semiconductor switching element 32 that constitutes the peripheral circuit, MPU, SRAM and so on can easily be consolidated.

If it is required to apply a voltage higher than that applied to the logic circuit, SRAM and so on in the memory that constitutes the semiconductor storage element 31, it is only required to add a mask for forming a high withstand voltage well and a mask for forming a high withstand voltage gate insulator to the mask for forming the MOSFET.

Conventionally, the process for forming the EEPROM has been significantly different from the ordinary MOSFET process in the process for consolidating an EEPROM and a logic circuit on one chip, and therefore, the number of masks and the number of processes have been significantly increased. In contrast to this, according to the present embodiment, many processes among the formation processes of the semiconductor storage element 31 and the semiconductor switching element 32 are common, and therefore, the number of masks and the number of processes can be remarkably reduced with regard to the process for consolidating the nonvolatile memory with the logic circuit. Therefore, the yield of chips in which the memory peripheral circuit, MPU, SRAM and so on and the nonvolatile memory are consolidated is improved, and the cost can be reduced.

Fourth Embodiment

With reference to FIGS. 5A through 5F, a fourth embodiment of the present invention will be described in detail.

In the present embodiment, the fact that the device of the logic circuit region and the device of the memory region can easily be formed in parallel with each other on an identical substrate without necessitating a complicated process will be described. More in detail, a photolithography process and an impurity implantation process are carried out after the formation of the gate electrode and before the deposition of the material that constitutes the memory function bodies on the sidewalls of the gate electrode. The fact that a semiconductor switching element and a semiconductor storage element can be fabricated in parallel with each other through the aforementioned processes by forming an LDD region selectively in the region where a semiconductor switching element of an ordinary structure is formed.

FIGS. 5A through 5F show mutually different devices on the right-hand side and the left-hand side, in which the semiconductor storage element in the memory region is shown on the right-hand side and the semiconductor switching element in the logic circuit region is shown on the left-hand side.

Figure 5A:
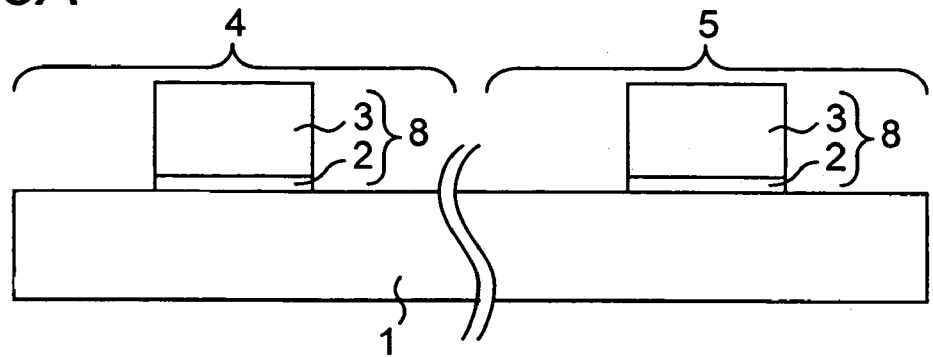
FIGS. 5A through 5F are sectional views showing manufacturing processes of a semiconductor device according to a fourth embodiment of the present invention.

First of all, as shown in FIG. 5A, a gate insulator 2 and a gate electrode 3 having a MOS structure, i.e., a gate stack 8 is formed on a semiconductor substrate 1 that has the p-type conductive type through a MOS (Metal-Oxide-Semiconductor) forming process. It is proper to use a method similar to the method shown in connection with the second embodiment as a manufacturing method for this gate stack 8.

Figure 5B:
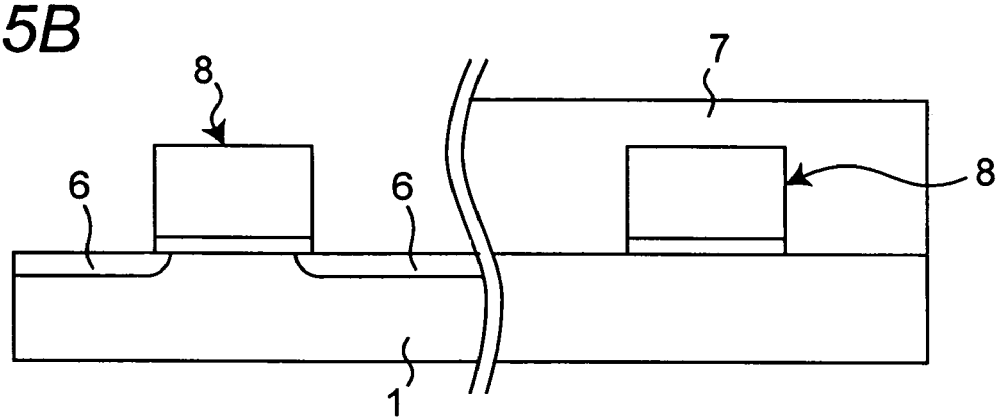

Next, as shown in FIG. 5B, LDD regions 6 are formed only in the logic circuit region 4 where a transistor of an ordinary structure is formed. In this stage, no LDD region is formed in the memory region 5 by forming a photoresist 7. The photoresist is to obstruct the impurity implantation and merely required to be selectively removable, and, for example, a dielectric film of nitride or the like can be used.

Figure 5C:
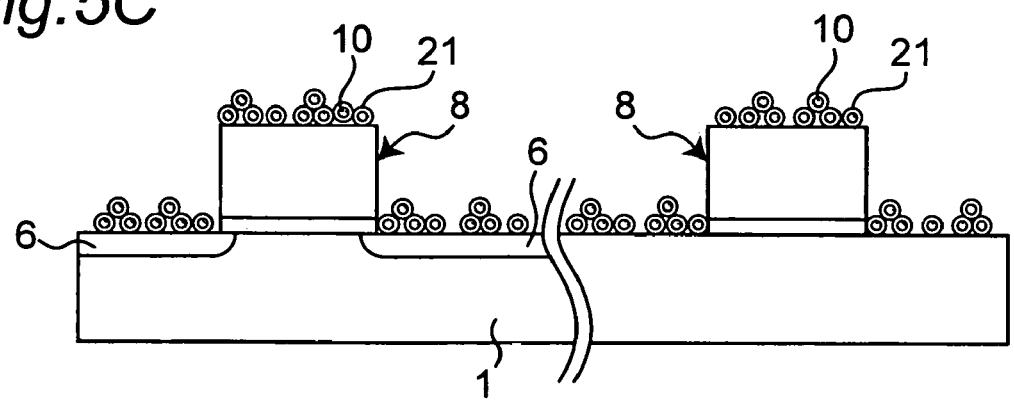

Next, as shown in FIG. 5C, charge retention portions constructed of silicon dots 10 whose surfaces are oxidized, i.e., constructed of the silicon dots 10 and wrap dielectric films 21 are deposited on the exposed surfaces of the gate stack 8 and the semiconductor substrate 1. It is proper to use a method similar to the method shown in connection with the second embodiment as a manufacturing method for the charge retention portions.

Figure 5D:
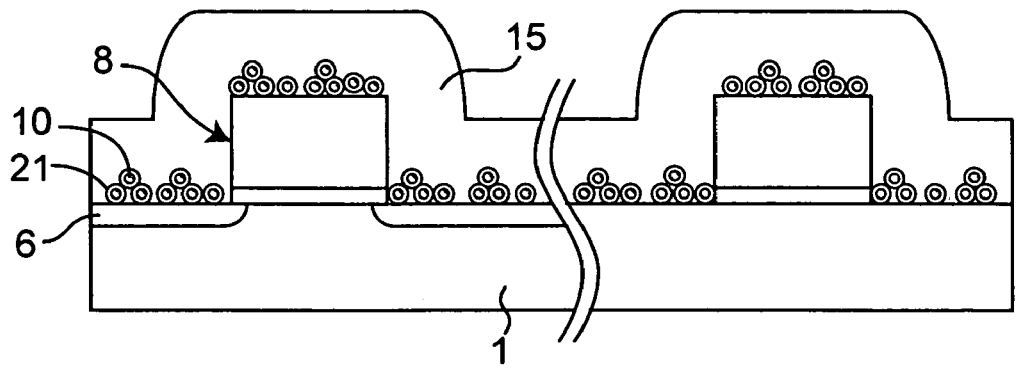

Next, as shown in FIG. 5D, a dielectric film 15 is roughly uniformly deposited on the exposed surfaces of the semiconductor substrate 1 and the gate electrode 3. It is proper to employ a film that has good step coverage by means of CVD such as HTO for this dielectric film 15. When formed by HTO, the dielectric film 15 is merely required to have a thickness of about 20 nm to 100 nm.

Figure 5E:
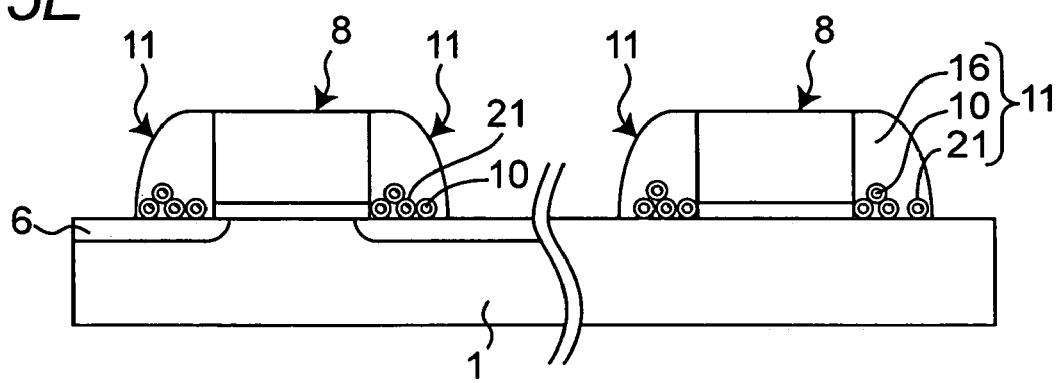

Next, as shown in FIG. 5E, the memory function bodies 11 constructed of the sidewall insulator 16, the silicon dots 10 and the wrap dielectric films 21 are formed in a sidewall spacer configuration by anisotropically etching the deposit dielectric film 15. It is proper to use a method similar to the method shown in connection with the second embodiment as a manufacturing method for the memory function bodies 11.

Figure 5F:
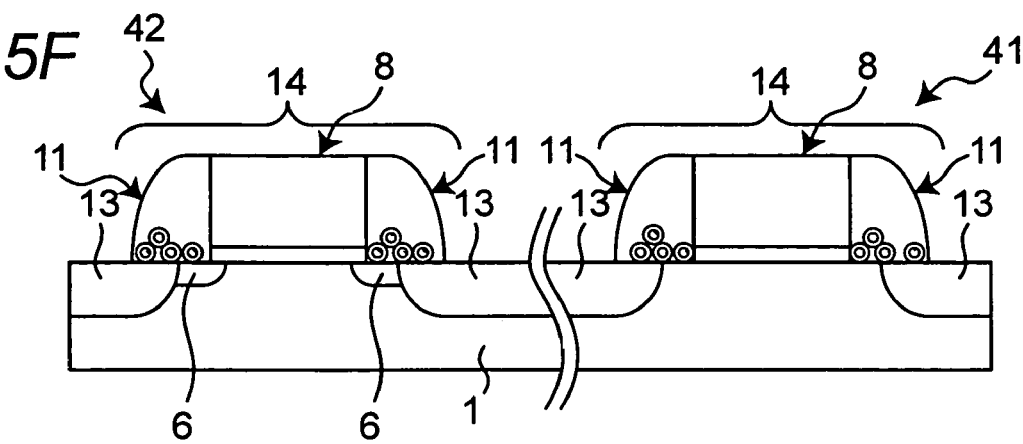

Next, as shown in FIG. 5F, impurity implantation is carried out by using source and drain implantation mask regions 14 constructed of the gate electrode 3 and the memory function bodies 11 as a mask, and source/drain diffusion regions 13 are formed in a self-alignment manner through prescribed heat treatment.

By using the above-mentioned processes, the LDD regions can be selectively formed in the logic circuit region on the identical semiconductor substrate 1, so that a semiconductor switching element 42 and a semiconductor storage element 41 can be simply formed in parallel with each other without necessitating a complicated process.

The channel forming region partially is intensely influenced by electric charge when the electric charge is retained in the memory function bodies 11 in the semiconductor storage element 41, and therefore, the drain current value changes. As a result, a semiconductor storage element, which distinguishes the presence or absence of electric charge, is formed.

Moreover, by separately arranging the gate insulator 2 and the memory function bodies 11 (both the gate insulator and the memory function bodies are not arranged below the gate electrode dissimilarly to the conventional arrangement), a transistor of an ordinary structure and a memory cell transistor can be formed in parallel with each other through the same manufacturing processes as those of the transistor of the ordinary structure. Therefore, by very simply carrying out the process of consolidating the memory peripheral circuit and the memory circuit, there can easily be manufactured a semiconductor device in which the memory peripheral circuit and the memory circuit are consolidated on the identical substrate.

According to the semiconductor storage element of the present embodiment, the short-channel effect is extremely restrained while achieving the storage of two bits per transistor, and miniaturization can be achieved. Moreover, high-speed operation and low power consumption can be achieved.

Moreover, the silicon dots 10 of the memory function bodies 11 are put in contact with the semiconductor substrate 1 and the gate electrode 3 via the wrap dielectric films 21, and therefore, the leakage of the retention electric charge can be effectively restrained. With the above arrangement, there is formed a semiconductor storage element, which has good charge retention characteristic and high long-term reliability.

Fifth Embodiment

With reference to FIGS. 6A through 6F, a fifth embodiment of the present invention will be described.

The semiconductor device manufacturing method of the present embodiment has roughly the same processes as those of the manufacturing method of the fourth embodiment. The semiconductor device manufacturing method of the fifth embodiment differs from the semiconductor device manufacturing method of fourth embodiment in that L-figured (in other words, L-shaped) polysilicon films 24 and L-figured dielectric films 12 are formed between the aggregate of the silicon dots 10, the wrap dielectric films 21 and the sidewall insulator 16 and each of the semiconductor substrate 1 and the gate stack 8. The semiconductor device fabricated according to the present embodiment can obtain an effect of restraining variations in the threshold voltage of the semiconductor storage element by virtue of the L-figured polysilicon films 24 and the L-figured dielectric films 12 in addition to the effects of the semiconductor device of the fourth embodiment. It is to be noted that the L-figured configuration merely means a configuration that has an angle and does not mean the complete right angle. The same thing can be said for the L-figured configuration hereinafter.

Also, in the present embodiment, a semiconductor storage element in a memory region and a semiconductor switching element in a logic circuit region are easily formed in parallel with each other through roughly common simple processes. More in detail, a region where an LDD diffusion region is formed and a region where no LDD diffusion region is formed are formed on an identical substrate, and the semiconductor switching element and the semiconductor storage element are formed in common.

FIGS. 6A through 6F show the semiconductor switching element to be formed in the logic circuit region 4 on the left-hand side and the semiconductor storage element to be formed in the nonvolatile memory region 5 on the right-hand side.

First of all, LDD regions 6 are formed on the surface of a semiconductor substrate corresponding to opposite sides of a gate stack 8 in the logic circuit region 4 on a semiconductor substrate 1 similarly to the manufacturing method of the fourth embodiment, forming the same structure as the structure shown in FIG. 5B.

Figure 6A:
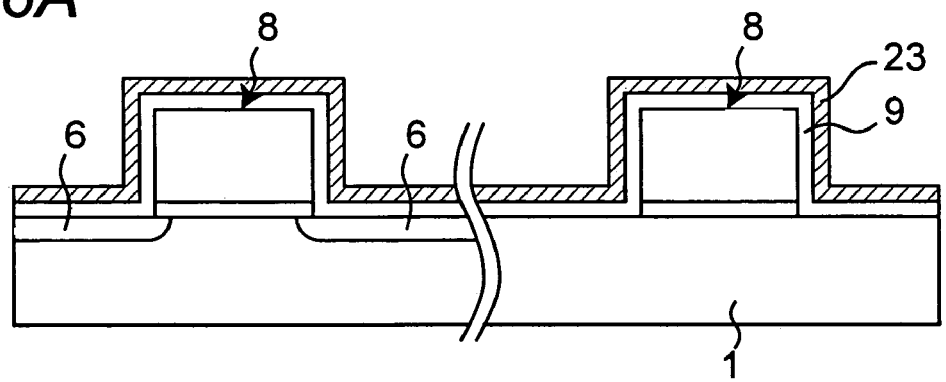
FIGS. 6A through 6F are sectional views showing manufacturing processes of a semiconductor device according to a fifth embodiment of the present invention.

Next, as shown in FIG. 6A, a first dielectric film 9 is formed to a roughly uniform thickness on the exposed surfaces of the gate stack 8 and the semiconductor substrate 1. For this first dielectric film 9, which becomes a dielectric film through which electrons pass, should properly be provided by a highly reliable film that has high withstand voltage and a small leakage current. For example, oxide such as thermal oxide, $N_2O$ oxide, NO oxide or the like is employed similarly to the material of the gate insulator 2. When any of these oxides is employed, its film thickness should preferably be about 1 nm to 20 nm. Furthermore, when the first dielectric film 9 is formed thin to the extent that a tunneling current flows through the film, a voltage necessary for electric charge injection and erase can be lowered, and this allows low power consumption to be achieved. A typical film thickness in this case is within a range of about 1 nm to 5 nm.

Subsequently, polysilicon 23 is deposited roughly uniformly on the first dielectric film 9. It is also acceptable to form nitride, oxynitride, oxide capable of retaining a substance of electrons, positive holes or the like having electric charge, a film constructed of a ferroelectric material capable of inducing electric charge on the surfaces of the memory function bodies by polarization or a similar phenomenon, a film constructed of a material of a conductor or a semiconductor capable of retaining electric charge in place of this polysilicon. The polysilicon 23 is only required to have a thickness within a range of about 2 nm to 100 nm.

Figure 6B:
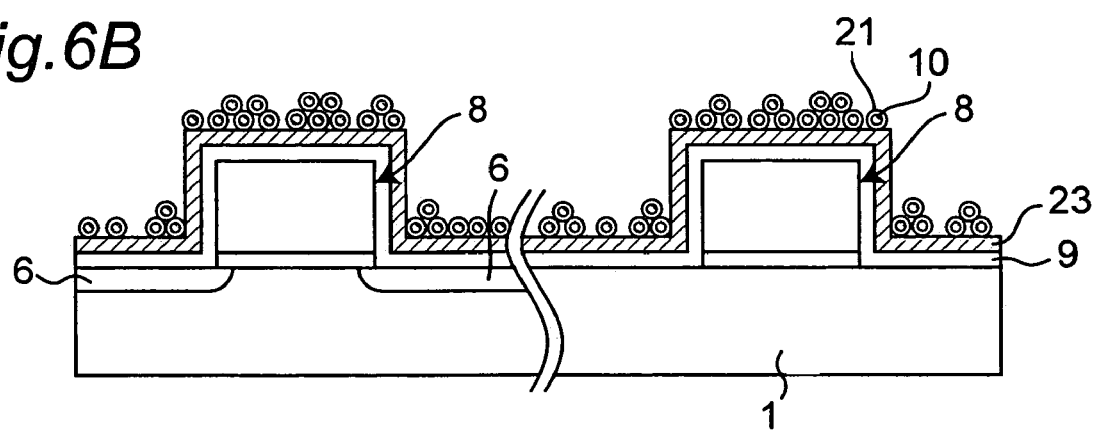

Next, as shown in FIG. 6B, charge retention portions, in which silicon dots 10 are wrapped in wrap dielectric films 21, are deposited on the polysilicon 23. As a formation method for the charge retention portions, it is proper to use a method similar to the method described in connection with the second embodiment.

Figure 6C:
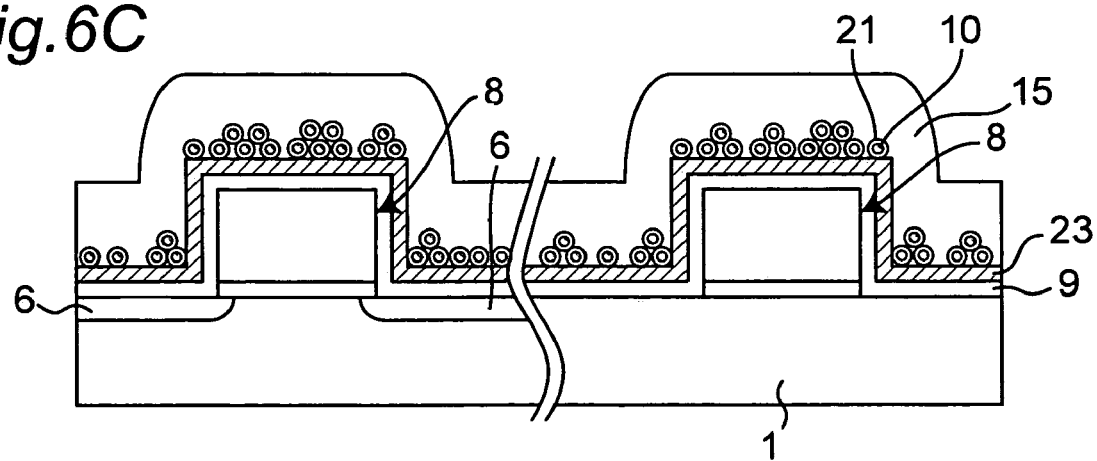

Next, as shown in FIG. 6C, an insulating material is deposited so as to cover the charge retention portions on the polysilicon 23, forming a deposit dielectric film 15 that has a roughly uniform thickness. It is proper to employ a film that has good step coverage by means of CVD for an HTO film for this dielectric film 15. When an HTO film is employed, the film thickness is only required to be about 10 nm to 100 nm. The deposit dielectric film 15 is etched back into a sidewall spacer configuration in the subsequent process and operates as an implantation mask in carrying out impurity implantation for forming source/drain diffusion regions. That is, the configurations of the source/drain diffusion regions and the offset dimensions of the source/drain diffusion regions with respect to the gate electrode are determined by the configuration and dimensions of this mask. Therefore, it is required to properly adjust the thickness of the deposit dielectric film 15 in order to appropriately set the configuration and the offset dimensions of the source/drain diffusion regions.

Figure 6D:
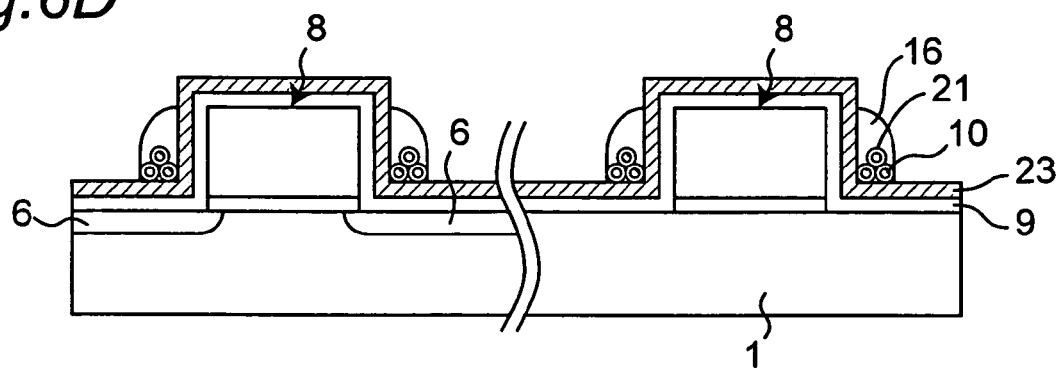

Next, as shown in FIG. 6D, the deposit dielectric film 15, the silicon dots 10 and the wrap dielectric films 21 are anisotropically etched. Through this process, the sidewall insulator 16 in the sidewall spacer configuration including the silicon dots 10 and the wrap dielectric films 21 is formed on opposite sides of each gate stack 8 via the first dielectric film 9 and the polysilicon 23. It is proper to carry out the anisotropic etching on condition that the dielectric film 15 and the wrap dielectric films 21 can be selectively etched and an etching selection ratio with respect to the polysilicon 23 is great. It is to be noted that the materials of the polysilicon 23 and silicon dots 10 are both silicon, and therefore, it is sometimes the case where the silicon dots to be etched remain unetched, generating residues. In this case, by isotropically etching the surface of the sidewall insulator 16 by means of isotropic wet etching using hydrofluoric acid or the like after the anisotropic etching, the residues of the silicon dots are lifted off. If the residues of the silicon dots still remain, then the silicon dots are oxidized and removed by isotropic wet etching using hydrofluoric acid or the like.

Figure 6E:
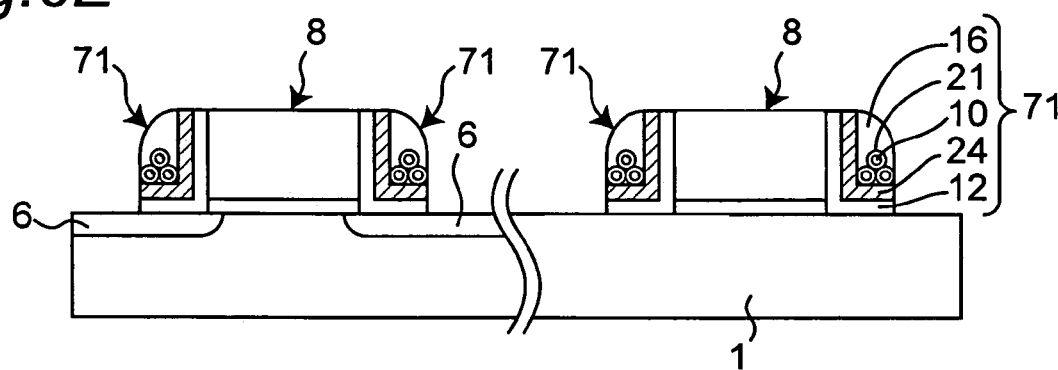

Next, as shown in FIG. 6E, by etching the polysilicon 23 and the first dielectric film 9 exposed on the surface using the sidewall insulator 16 that includes the wrap dielectric films 21 and the silicon dots 10 as a mask, an L-figured polysilicon 24 and an L-figured insulator 12 having an L-figured configuration are formed. It is proper to carry out the above-mentioned etching on condition that the polysilicon 23 and the first dielectric film 9 can be selectively etched and an etching selection ratio with respect to the semiconductor substrate 1 is great. Through this process, memory function bodies 71, each of which is constructed of the L-figured insulator 12, the L-figured polysilicon 24, the silicon dots 10, the wrap dielectric films 21 and the sidewall insulator 16, are formed.

Moreover, it is acceptable to carry out all the processes from the process of FIG. 6C to the process of FIG. 6E in one process. That is, there is carried out anisotropic etching, which can selectively etch every one of the first dielectric film 9, the polysilicon 23, the silicon dots 10, the wrap dielectric films 21 and the deposit dielectric film 15 and of which the etching selection ratio condition with respect to the material of the gate electrode 3 and the material of the semiconductor substrate 1 is great. Through this process, the normally required two processes can be achieved in one process, and therefore, the number of processes can be reduced. However, since silicon is used as a typical example in the present embodiment as the materials of the silicon dots 10, the polysilicon 23 and the gate electrode 3 and the material of semiconductor substrate 1, it is difficult to set a great etching selection ratio with respect to the materials of the semiconductor substrate 1 and the gate electrode 3. Accordingly, although the polysilicon 23 and the silicon dots 10 are left, the first dielectric film 9 and the deposit dielectric film 15 are etched on an etchable condition, and thereafter, thermal oxidation is carried out to partially or totally oxidize the residues due to the polysilicon 23 and the silicon dots 10 left as described above. Subsequently, by isotropically etching the surface of the sidewall insulator 16 by means of wet etching, the residues of the silicon dots are lifted off. If the residues still remain, it is proper to oxidize the residual silicon dots and use the isotropic wet etching using hydrofluoric acid or the like.

Although not shown, the first dielectric film 9 is not required to be etched in the process before the process of FIG. 6E. By utilizing the first dielectric film 9 left unetched as a protection film for impurity implantation in the subsequent process, a process for independently forming a protection film for implantation can be eliminated.

In this case, with regard to the L-figured polysilicon 24 that constitutes the memory function bodies 71, it is required to mutually insulate the memory function bodies 71 located on the right-hand side and the left-hand side of the gate electrode 3 after the formation of the memory function bodies 71. The same thing can be said for the case where they are formed by using a material that includes a conductor or a semiconductor having electric conductivity other than the polysilicon. Hereinafter, the portion that is formed of the material that has electric conductivity including the polysilicon and corresponds to the L-figured polysilicon 24 is referred to as an L-figured conductor 18.

FIG. 7A is a plan view showing the surface of the semiconductor substrate 1 in the process of FIG. 6E. As shown in FIG. 7A, portions (removal regions) of the sidewall insulator 16 of the memory function body 71 are removed by etching. A removal method carries out patterning of the photoresist so as to cover the sidewall insulator 16 other than the removal regions by using the well-known photolithography process. Subsequently, anisotropic etching is carried out to remove the removal regions that are the exposed portions of the sidewall insulator 16. The anisotropic etching is carried out on condition that the sidewall insulator 16 can be selectively etched and an etching selection ratio with respect to the gate electrode 3 is great. The removal regions should preferably exist on the device isolation region.

Furthermore, portions (removal regions of FIG. 7B) of the L-figured conductor 18 are removed by using an isotropic or anisotropic etching, forming a configuration as shown in FIG. 7B. A removal method carries out patterning of the photoresist so as to cover the L-figured conductor 18 other than the removal regions by using the well-known photolithography process. Subsequently, anisotropic etching is carried out to remove the removal regions that are the exposed portions of the L-figured conductor 18. The etching should preferably be carried out on condition that the L-figured conductor 18 can be selectively etched and an etching selection ratio with respect to the L-figured insulator 12 and the gate electrode 3 is great. It is to be noted that, when the same material as that of the gate electrode is used as the material of the L-figured conductor 18, this selection ratio with respect to the gate electrode 3 cannot be set great. Accordingly, it is preferable to leave the first dielectric film 9 unetched in the process of FIG. 6E in order to avoid the etching of the gate electrode 3. As a result, the first dielectric film 9 can bear the roles of a protection film for the gate electrode 3 during the etching and a protection film for implantation in the subsequent implantation process. Therefore, the number of processes can be reduced, and the manufacturing cost can be reduced.

In this case, the removal regions of the L-figured conductor 18 should preferably exist on the device isolation region similarly to the sidewall insulator 16. Moreover, when the first insulator 9 is left so as to cover the upper surface of the gate electrode 3, short-circuit between the contacts of the source and the drain and the gate electrode 3 can be restrained, and this facilitates miniaturization and allows the memory to have a higher degree of integration.

Moreover, as shown in the plan view of FIG. 7B, portions (removal regions) of the memory function body 71 can be removed at once by etching leaving the L-figured insulator 12. This removal method carries out patterning of the photoresist so as to cover the memory function body 71 other than the removal regions by using the well-known photolithography process. Subsequently, the removal regions, which are the exposed portions of the memory function body, are removed by using anisotropic etching. The above-mentioned etching is carried out on condition that the L-figured polysilicon 24, the silicon dots 10, the wrap dielectric films 21 and the sidewall insulator 16 can be selectively etched and an etching selection ratio with respect to the L-figured insulator 12 is great. In this typical example, nitride is used as the first insulator. It is to be noted that the removal regions should preferably exist on the device isolation region. As a result of the above-mentioned selective etching, the L-figured insulator 12 is left in a configuration as shown in FIG. 6D, covering the outer periphery of the gate electrode 3. Therefore, the short-circuit between the contacts of the source and the drain and the gate electrode 3 can be restrained. This facilitates miniaturization and allows the memory to have a higher degree of integration.

Figure 6F:
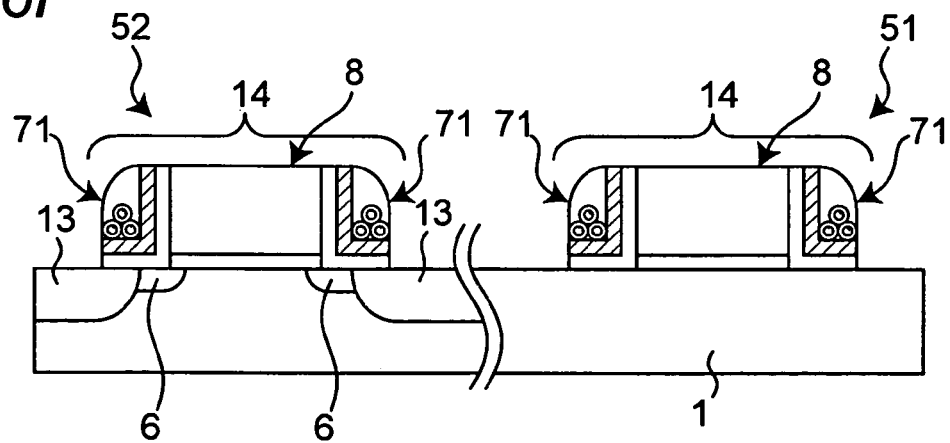

Next, as shown in FIG. 6F, by carrying out impurity implantation using the source/drain implantation mask region 14 constructed of the gate electrode 3 and the memory function body 71 as a mask and carrying out the desired heat treatment, the source/drain diffusion regions 13 are formed in a self-alignment manner. Subsequently, through the well-known processes, a semiconductor device provided with a semiconductor switching element 52 and a semiconductor storage element 51 is formed.

As described above, the semiconductor switching element 52, which is employed in the logic circuit region and in which the LDD region is formed and the semiconductor storage element 51 employed in the memory region can easily be formed in parallel with each other on an identical substrate through a comparatively small number of processes without using a complicated process.

When electric charge is retained in the storage retention portions of the memory function body 71, the channel forming region of the semiconductor storage element 51 is partially intensely influenced by the electric charge, and therefore, the drain current value changes. By distinguishing the presence or absence of electric charge by this change in the current value, the memory function is produced.

According to the semiconductor device manufacturing method of the present embodiment, by separately arranging the gate stack 8 and the memory function bodies 71 of the semiconductor storage element 51, the semiconductor storage element 51 and the semiconductor switching element 52 can be consolidated on one semiconductor substrate 1 without largely changing the processes or increasing the number of processes in comparison with the manufacturing processes of the standard MOSFET. Therefore, the manufacturing cost for consolidating the memory region and the logic circuit region on one chip can be remarkably reduced.

Moreover, the semiconductor storage element 51 in which the source/drain diffusion regions 13 and 13 are offset to the gate electrode 3 and the semiconductor switching element 52 having no offset can be formed on the identical substrate through a self-alignment process. Therefore, the semiconductor storage element 51 that has a high memory effect and the semiconductor switching element 52 that has a high current driving capability can be simply consolidated without using a complicated process.

Furthermore, according to the semiconductor device manufacturing method of the present embodiment, there can be obtained a semiconductor storage element, which achieves the storage of two bits per transistor. Therefore, the occupation area of the memory device per bit can be shrunk, and a memory of a large capacity can be formed with the same dimensions as in the conventional case.

Moreover, the silicon dots 10 are put in contact with the semiconductor substrate 1 and the gate electrode 3 at least via the wrap dielectric films 21 in the memory function bodies 71, and therefore, the leakage of the retention electric charge can be effectively restrained. Therefore, the semiconductor storage element 51, which has a good charge retention characteristic and high long-term reliability, can be formed.

Furthermore, by forming thin the L-figured dielectric film 12 located between the semiconductor substrate 1 and the L-figured polysilicon film 24, the sidewall insulator 16 and the wrap dielectric films 21 located between the L-figured polysilicon film 24 and the silicon dots 10 and the wrap dielectric films 21 located between mutually adjoining silicon dots 10 to the extent that a tunneling current flows, the Coulomb blockade effect due to the double tunnel junction can be produced. With this arrangement, the voltage needed during electric charge injection and erase can be lowered with the electric charge retained stable. Therefore, low power consumption can be achieved.

Moreover, by arranging a film (L-figured polysilicon film 24 in the present embodiment) constructed of a semiconductor or a conductor between the semiconductor substrate 1 and the plurality of silicon dots 10, the influence exerted from variations in the position and size of the silicon dots 10 on the semiconductor substrate 1 can be restrained. Therefore, a semiconductor storage element and a semiconductor device of high reliability, in which read errors are restrained, can be provided.

Sixth Embodiment

Figure 8:
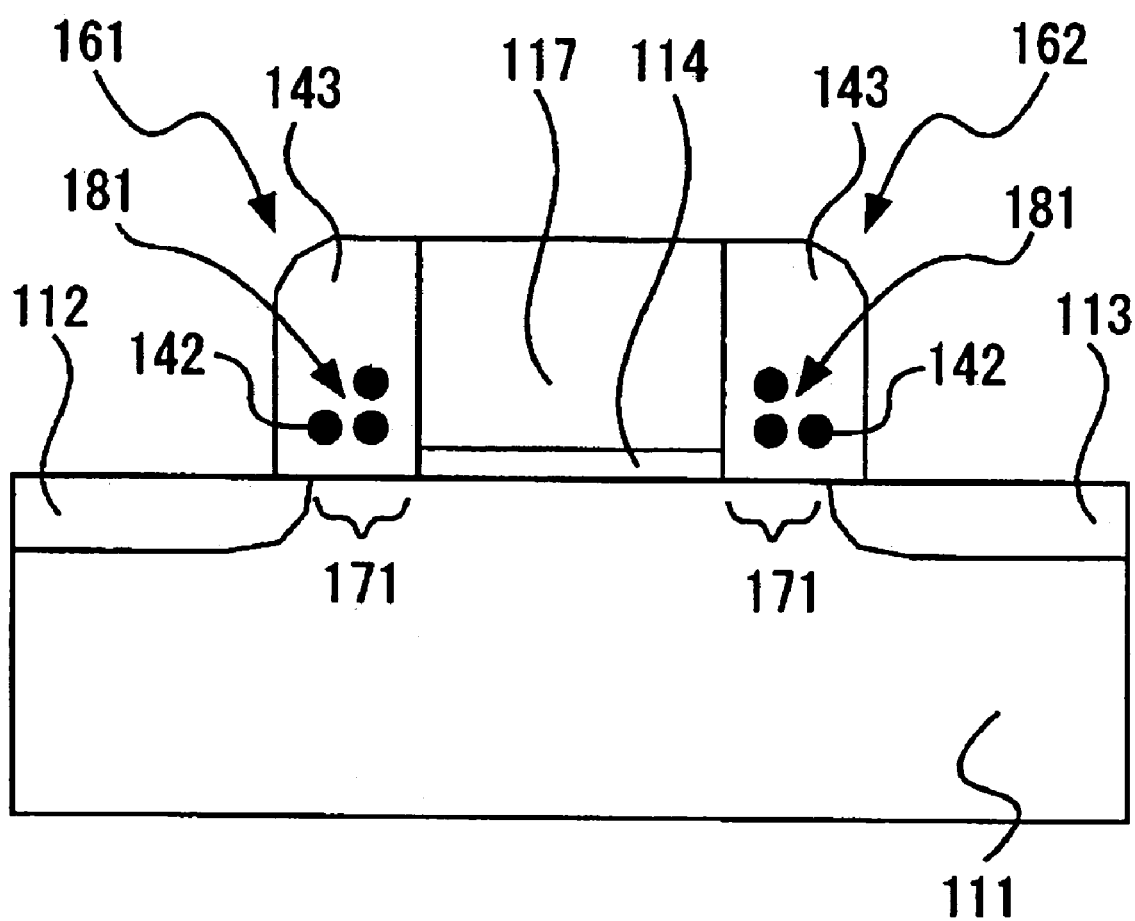
FIG. 8 is a sectional view showing a structure of a semiconductor storage element according to a sixth embodiment of the present invention.

In a sixth embodiment, the structure of the memory function bodies possessed by the semiconductor storage element of the present invention is optimized. The memory function bodies of the present invention are each constructed of a region capable of retaining electric charge (electric charge storing region, which may be a film that has a function to retain electric charge) and a region for making electric charge hard to escape (the region may be a film that has a function to make electric charge hard to escape). For example, as shown in FIG. 8, memory function bodies 161 and 162 are each constructed of charge retention portions constructed of silicon particles 142 and a wrap silicon oxide and a silicon oxide 143 formed so as to cover the portions. In this case, the silicon particles 142 produce a function capable of retaining the electric charge. The wrap silicon oxide and the silicon oxide 143 acts as a film having a function to make the electric charge stored in the silicon particles 142 hard to escape. In FIG. 8, the wrap silicon oxide and the silicon oxide 143 that covers this are made of the same material, and therefore, no borderline is shown.

Moreover, the regions (silicon particles 142) that can retain electric charge in the memory function bodies 161 and 162 overlap the source/drain diffusion regions 112 and 113, respectively. In this case, the term of "overlap" means that at least part of the regions (silicon particles 142) that can retain electric charge exists on at least part of the source/drain diffusion regions 112 and 113. In the case where the silicon particles 142 of the memory function bodies 161 and 162 overlap the source/drain diffusion regions 112 and 113, the charge retention portions including the silicon particles 142 naturally overlap the source/drain diffusion regions 112 and 113. In FIG. 8, there are shown a semiconductor substrate 111, a gate insulator 114, a gate electrode 117 and offset regions 171 (located between the gate electrode and the source/drain diffusion regions). A surface portion of the semiconductor substrate 111 located under the gate insulator 114 serves as a channel forming region.

The effects of the overlap between the silicon particles 142 in the memory function bodies 161 and 162 and the source/drain diffusion regions 112 and 113 will be described below.

Figure 9:
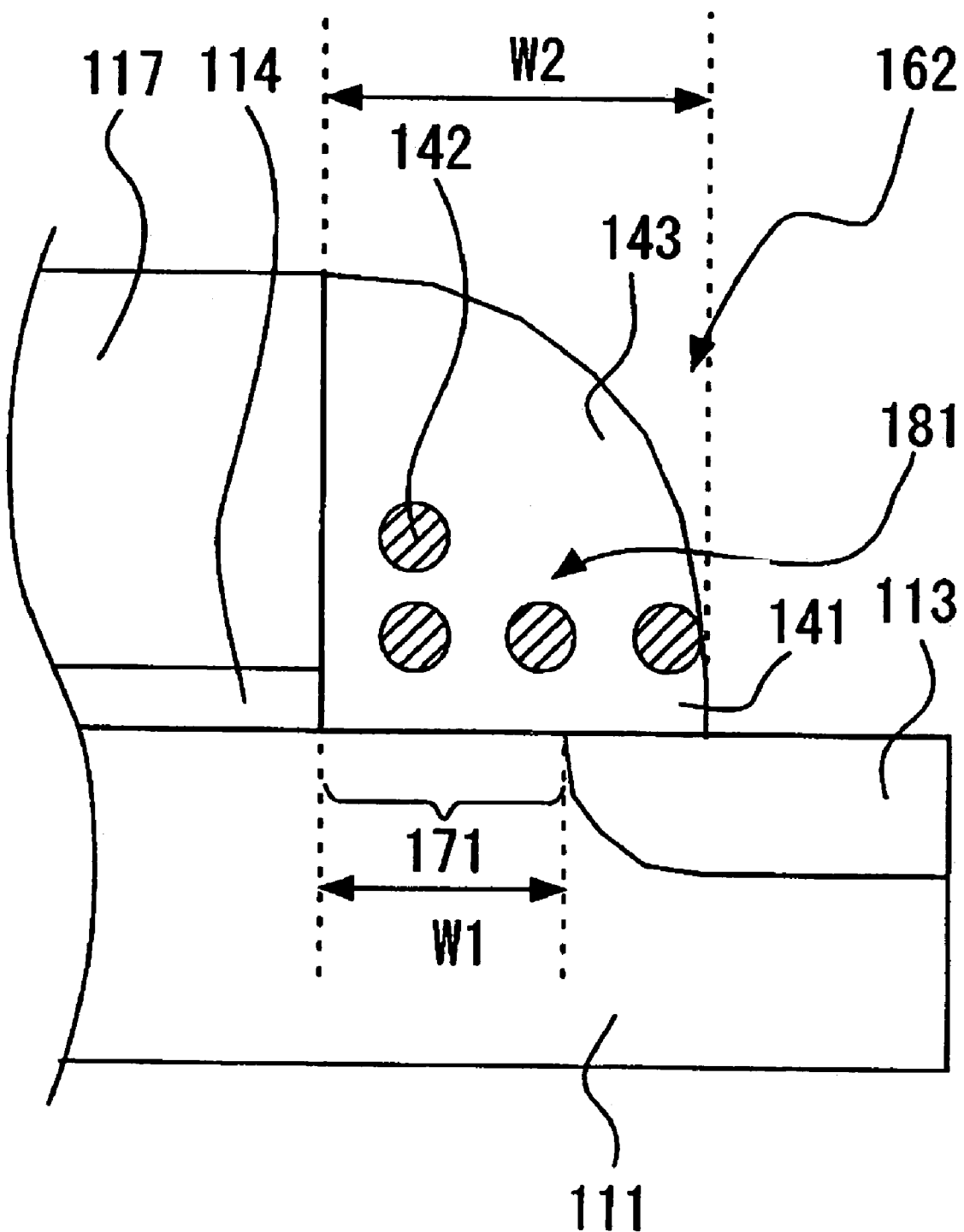
FIG. 9 is an enlarged view showing a peripheral portion of a memory function body of the semiconductor storage element of FIG. 8.

FIG. 9 is an enlarged view of a peripheral portion of the memory function body 162 located on the right-hand side of FIG. 8. The reference numeral W1 indicates the amount of offset between the gate electrode 114 and the source/drain diffusion region 113. Moreover, the reference numeral W2 indicates the width of the memory function body 162 in a cross-sectional plane in the channel-length direction of the gate electrode. Since the end of the silicon particle 142 located in the memory function body 162 on the side far from the gate electrode 117 coincided with the end of the memory function body 162 located on the side far from the gate electrode 117, the width of the memory function body 162 was defined as W2. The amount of overlap between the memory function body 162 and the diffusion region 113 is expressed by W2−W1. What is especially important is that the silicon particles 142 in the memory function bodies 162 overlap the diffusion region 113, i.e., a relation of W2>W1 is satisfied.

Figure 10:
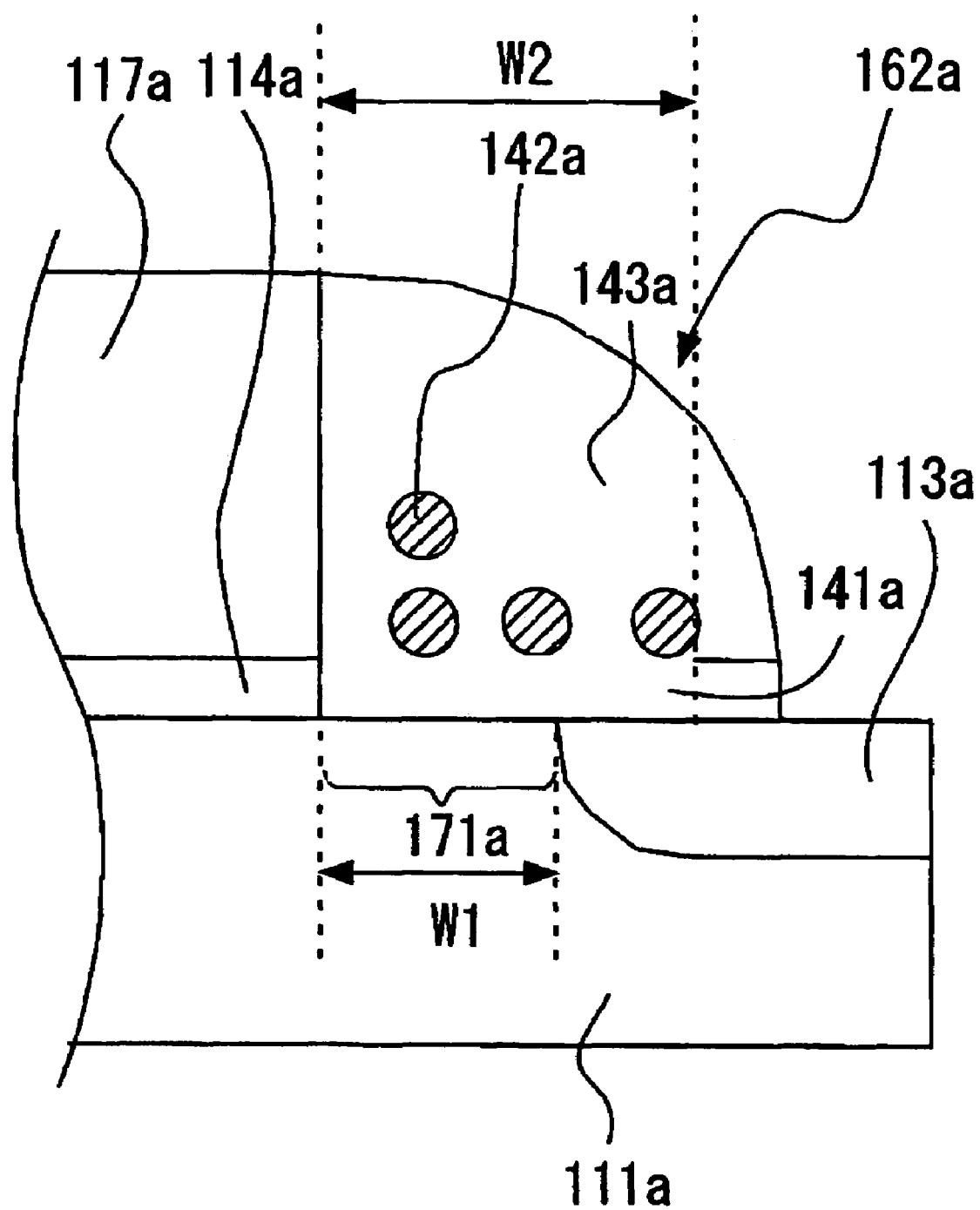
FIG. 10 is a sectional view showing a memory function body in which particles are different in arrangement position with regard to the memory function body provided for the semiconductor storage element of the sixth embodiment.

As shown in FIG. 10, in the case where the end of a silicon particle 142a located in the memory function body 162a on the side far from the gate electrode does not coincide with the end of the memory function body 162a located on the side far from the gate electrode, it is proper to define W2 from end of the gate electrode to the end of the silicon particle 142a located on the side far from the gate electrode.

With regard to a drain current in the erased state (holes are accumulated) in the structure of FIG. 9, a sufficient current value can be obtained in the configuration in which the silicon particle 142 and the source/drain diffusion region 113 overlap each other. However, in a configuration in which the silicon particle 142 and the source/drain diffusion region 113 do not overlap each other, the current is rapidly reduced when the distance between the silicon particle 142 and the source/drain diffusion region 113 is increased, and the current is reduced by about three orders of magnitude when they are set apart by about 30 nm.

Since the drain current value is almost proportional to the speed of read operation, the performance of the memory rapidly deteriorates as the distance between the silicon particle 142 and the source/drain diffusion region 113 increases. On the other hand, within the range in which the silicon particle 142 and the source/drain diffusion region 113 overlap each other, the reduction in the drain current is gradual. Therefore, it is preferable that at least part of the silicon particle 142, which is the film having the function to retain electric charge, overlaps the source/drain region.

With regard to read of the information stored in the memory function body 161 (region 181), it is preferable to form a pinchoff point on the side near the drain region in the channel forming region by using the source/drain diffusion region 112 as a source electrode and using the source/drain diffusion region 113 as a drain region. That is, when reading the information stored in one of the two memory function bodies, it is preferable to form the pinchoff point within the channel forming region near the other memory function body. With this arrangement, the storage information of the memory function body 161 can be detected with satisfactory sensitivity regardless of the storage situation of the memory function body 162, and this becomes a large factor in enabling the two-bit operation.

When information is stored into only one of two memory function bodies 161 and 162 or when the two memory function bodies 161 and 162 are used in the same storage state, the pinchoff point is not necessarily be formed during read.

Although not shown in FIG. 9, it is preferable to form a well region (p-type well in the case of an n-channel device) on the surface of the semiconductor substrate 111. By forming the above-mentioned well region, it becomes easy to control the other electric characteristics (withstand voltage, junction capacitance and short-channel effect) while optimizing the impurity concentration of the channel forming region to memory operations (rewrite operation and read operation).

From the viewpoint of improving the retention characteristic of the memory, the memory function bodies 161 and 162 should preferably include particles that have the function capable of retaining electric charge and a dielectric film. In the present embodiment, there are employed the silicon particles 142 that have a level at which the electric charge is trapped as particles, the wrap silicon oxide that has a function to prevent the dispersion of the electric charge accumulated in the particles as a dielectric film and the silicon oxide 143. The memory function bodies 161 and 162 are able to have an improved retention characteristic while preventing the dispersion of electric charge by including the particles and the dielectric film.

Figure 11:
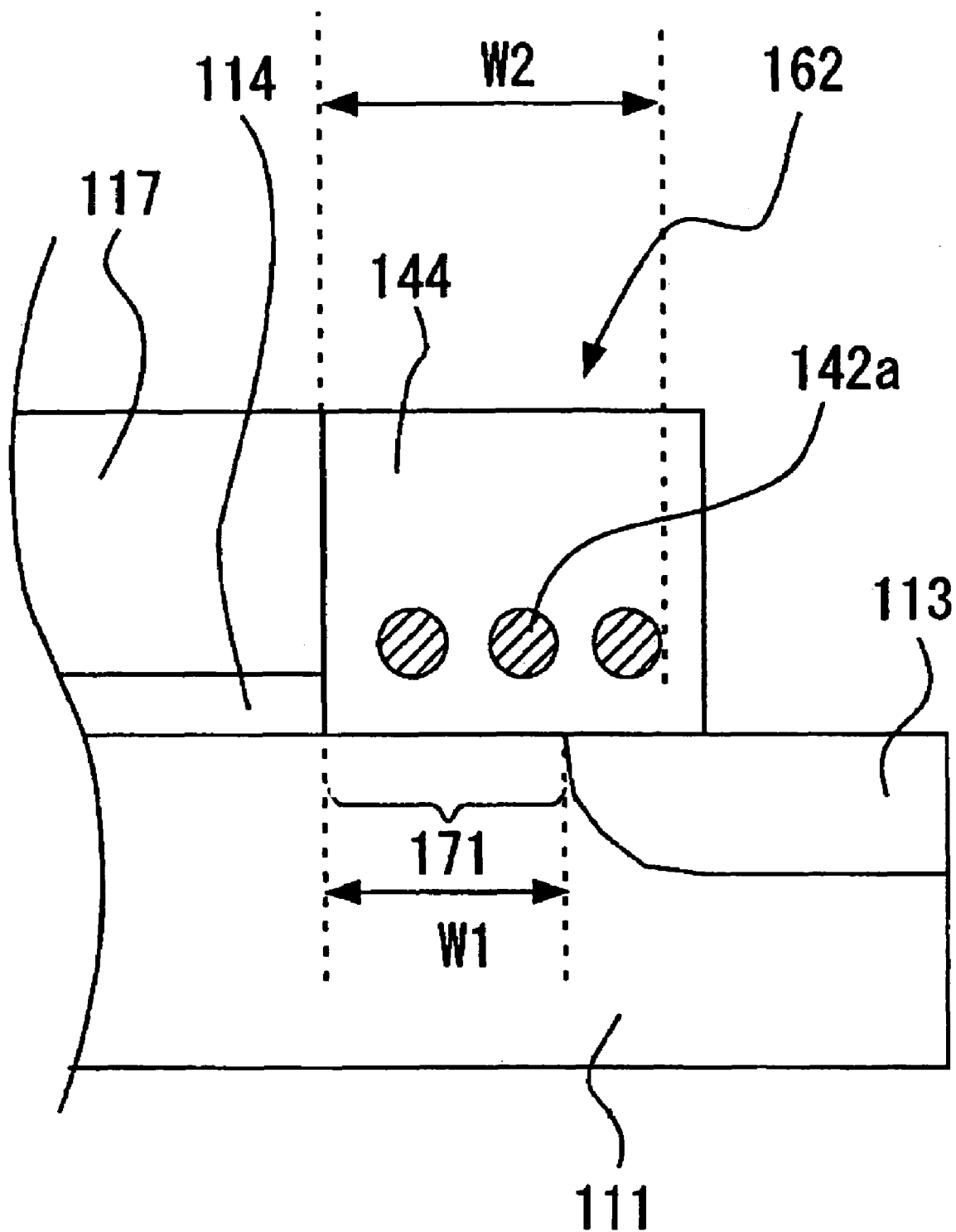
FIG. 11 is a sectional view showing another memory function body provided for the semiconductor storage element of the sixth embodiment.

Moreover, the memory function bodies 161 and 162 should preferably include particles arranged roughly parallel to the surface of the gate insulator so that the particles in the memory function bodies are located at an equal distance from the upper surface of the gate insulator. In concrete, as shown in FIG. 11, the silicon particles 142 of the memory function body 162 are arranged roughly parallel to the surface of the gate insulator 114. That is, the particles 142 should preferably be uniformly formed at a prescribed distance from a plane extended from the surface of the gate insulator 114.

By virtue of the particles 142 existing in the memory function body 162 roughly parallel to the surface of the gate insulator 114, the formability of an inversion layer in the offset region 171 can be effectively controlled by the amount of electric charge accumulated in the particles 142, and consequently, the memory effect can be increased. Moreover, by arranging the particles 142 roughly parallel to the surface of the gate insulator 114, a change in the memory effect can be maintained comparatively small even when the offset amount (W1) varies, and variations in the memory effect can be restrained. In addition, the electric charge retained in the particles 142 is restrained from moving in a direction away from the semiconductor substrate, and therefore, a characteristic change due to electric charge during storage retention can be restrained from occurring.

Furthermore, in the memory function body 162, an insulator (portion of a silicon oxide 144 above the offset region 171 in the present embodiment) should preferably exist between the particles 142 arranged roughly parallel to the surface of the gate insulator 114 and the channel forming region (or a well region). With this insulator, there can be obtained a semiconductor storage element, which has a better retention characteristic and in which the electric charge accumulated in the particles 142 is restrained from dispersing into the semiconductor substrate 111.

By controlling the size of the particles 142 and controlling constant the film thickness of the insulator (portion of the silicon oxide 144 above the offset region 171) below the particles 142, a distance from the surface of the semiconductor substrate 111 to the electric charge stored in the particles 142 can be maintained roughly constant. That is, the distance from the surface of the semiconductor substrate 111 to the electric charge stored in the particles 142 can be controlled within a range from a minimum film thickness value of the insulator located below the particles 142 to the sum of a maximum film thickness value of the insulator located below the particles 142 and a maximum value of the size of the particles 142. With this arrangement, the density of electric lines of force generated by the electric charge stored in the particles 142 can be controlled, and variations in the memory effect of the semiconductor storage element can be remarkably reduced.

Seventh Embodiment

In a seventh embodiment, the distances between the gate electrode, the memory function bodies and the source/drain regions are optimized in a semiconductor storage element that has the same structure as that of the semiconductor storage element of the sixth embodiment. In the present embodiment, the components having the same functions as those of the sixth embodiment are denoted by same reference numerals, and no detailed description is provided therefor.

Figure 12:
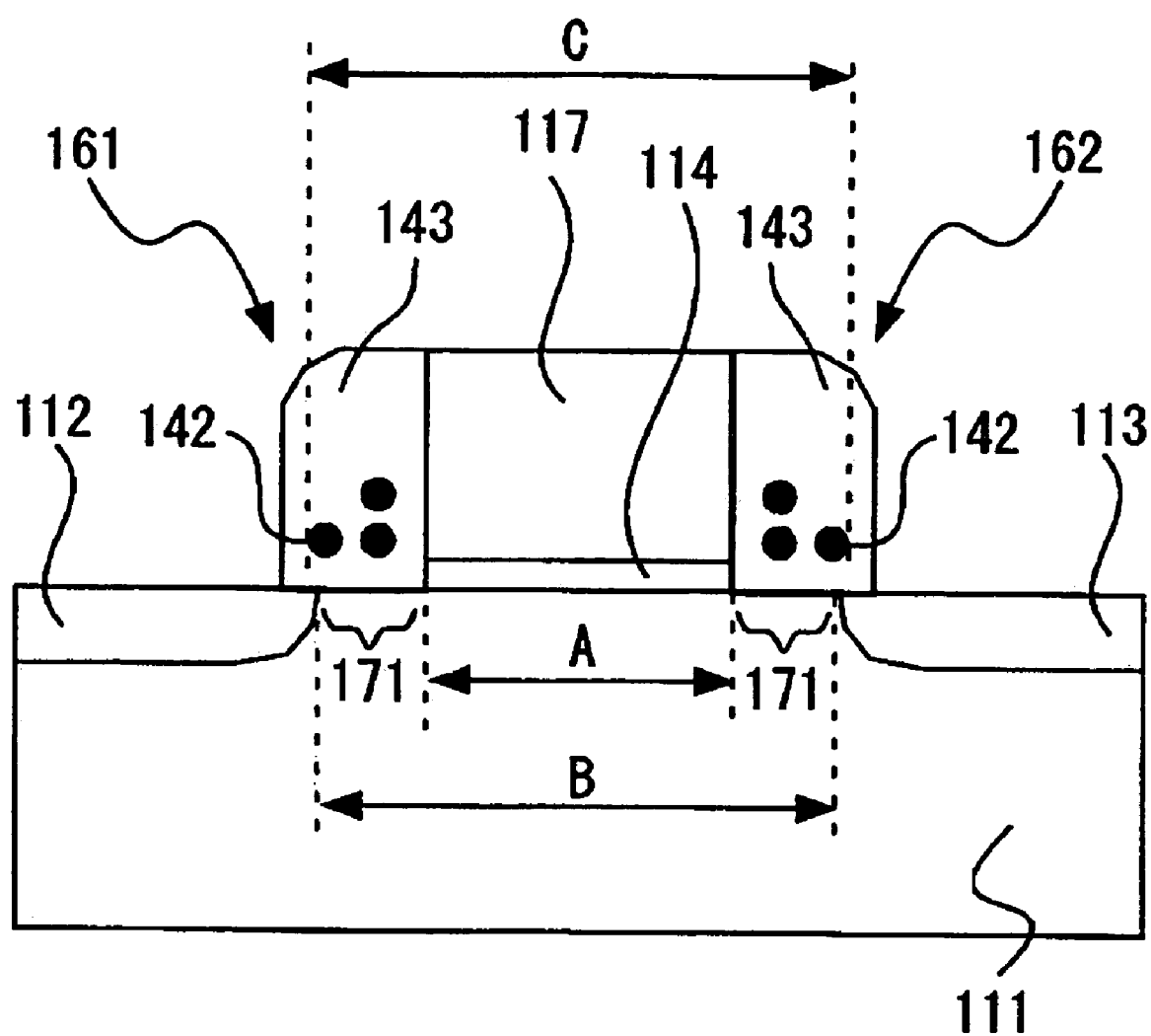
FIG. 12 is a sectional view showing a semiconductor storage element according to a seventh embodiment of the present invention.

In FIG. 12, the reference character "A" denotes a gate electrode length in the cross-sectional plane in the channel-length direction, "B" denotes a distance (channel-length) between the source/drain regions, and "C" denotes a length from the end of one memory function body to the end of the other memory function body, i.e., a distance from the end (on the side remote from the gate electrode) of a film that has a function capable of retaining electric charge in one memory function body to the end (on the side remote from the gate electrode) of a film that has a function capable of retaining electric charge in the other memory function body in the cross-sectional plane in the channel-length direction.

First of all, with regard to the aforementioned distances, it is preferable that B<C. The channel forming region includes the offset regions 171 between the portion below the gate electrode 117 and the source/drain regions 112 and 113. Because B<C, the invertibility is effectively changed in the entire region of the offset regions 171 by the electric charge accumulated in the memory function bodies 161 and 162 (silicon particles 142). Therefore, the memory effect is increased, and, in particular, the speed of the read operation is increased.

Moreover, when the gate electrode 117 and the source/drain regions 112 and 113 are offset to each other, i.e., when A<B holds, the invertibility of the offset regions when a voltage is applied to the gate electrode 117 is largely changed by the amount of electric charge accumulated in the memory function bodies 161 and 162, so that the memory effect can be increased and the short-channel effect can be reduced. It is to be noted that the offset regions 171 are not always required to exist so long as the memory effect is produced. Even if there is no offset region 171, the memory effect can be produced in the memory function bodies 161 and 162 (silicon particles 142) so long as the impurity concentration in the source/drain regions 112 and 113 is sufficiently low.

According to the aforementioned facts, it is most preferable that A<B<C.

Eighth Embodiment

Figure 13:
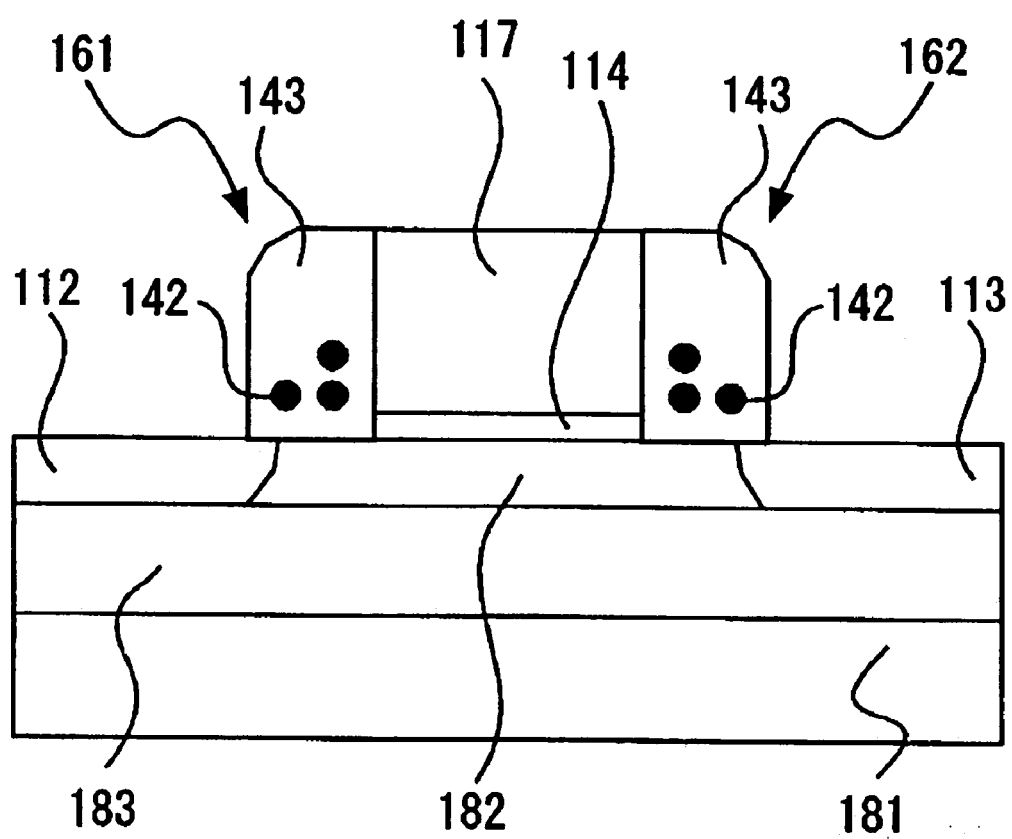
FIG. 13 is a sectional view showing a semiconductor storage element according to an eighth embodiment of the present invention.

As shown in FIG. 13, the semiconductor storage element of an eighth embodiment has the same construction as that of the semiconductor storage element of the sixth embodiment except for an SOI substrate provided in place of the semiconductor substrate. The components having the same functions as those of the sixth embodiment are denoted by same reference numerals, and no detailed description is provided therefor.

According to the semiconductor storage element of the present embodiment, a substrate floating effect, which is characteristic of the SOI substrate, is easily produced, and the effect can improve a hot electron generation efficiency and increase write speed.

As shown in FIG. 13, in this semiconductor storage element, an embedded oxide 183 is formed on a substrate 181, and a SOI layer is further formed on it. Source/drain diffusion regions 112 and 113 are formed in this SOI layer, and the other region serves as a body region 182.

The semiconductor storage element of the present embodiment also produces operative effects similar to those of the semiconductor storage element of the sixth embodiment. Furthermore, a junction capacitance between the source/drain diffusion regions 112 and 113 and the body region 182 can be remarkably reduced, and therefore, it becomes possible to achieve an increase in the operation speed and a low power consumption of the device.

Ninth Embodiment

Figure 14:
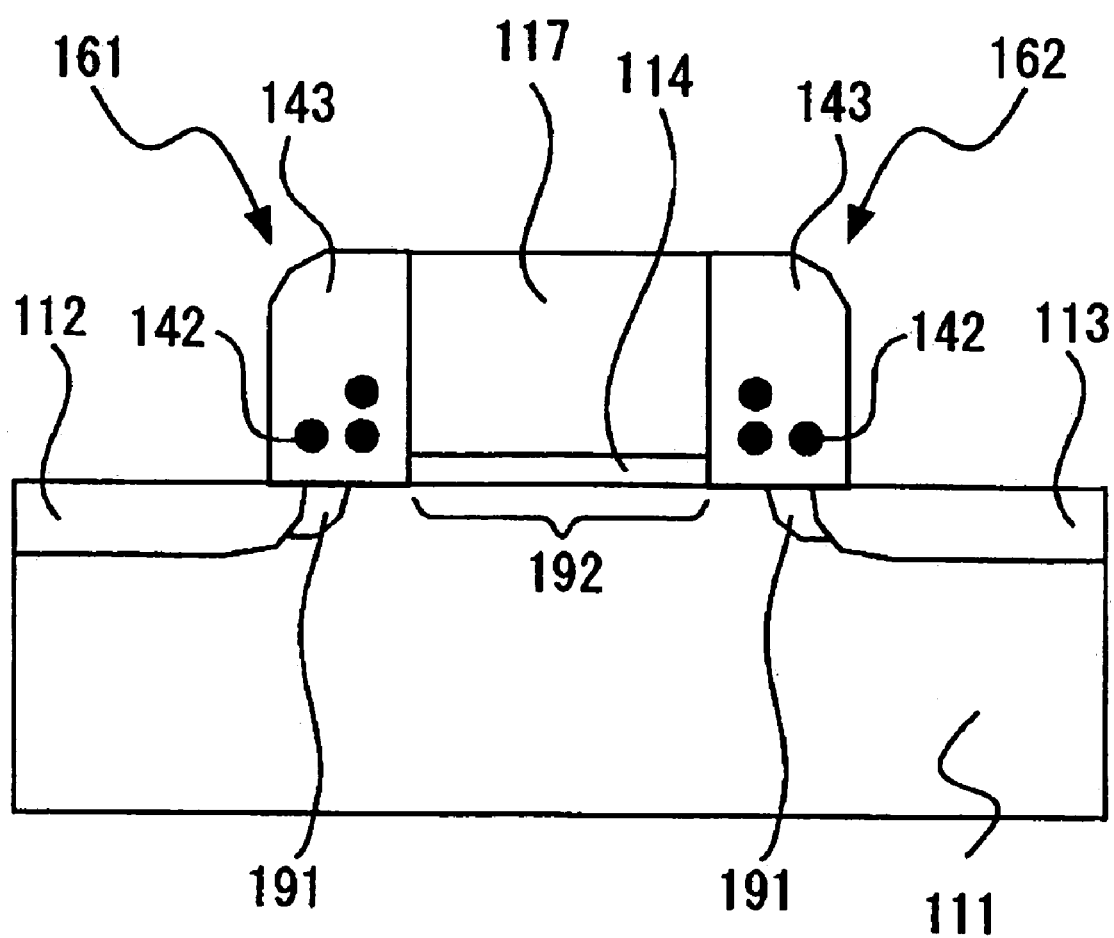
FIG. 14 is a sectional view showing a semiconductor storage element according to a ninth embodiment of the present invention.

As shown in FIG. 14, the semiconductor storage element of a ninth embodiment has the same construction as that of the semiconductor storage element of the sixth embodiment except for p-type high-concentration regions 191 added adjacently to the channel forming regions of the n-type source/drain regions 112 and 113. The components having the same functions as those of the sixth embodiment are denoted by same reference numerals, and no detailed description is provided therefor.

The concentration of an impurity (e.g., boron) that gives p-type doping to the p-type high-concentration regions 191 is made higher than the impurity concentration that gives p-type doping to a region 192 located just below the gate electrode. It is appropriate that the p-type impurity concentration in the p-type high-concentration regions 191 is, for example, about $5 \times 10^{17}$ cm$^{-3}$ to $1 \times 10^{19}$ cm$^{-3}$. The p-type impurity concentration in the region 192 located just below the gate electrode is allowed to have a concentration of, for example, $5 \times 10^{16}$ cm$^{-3}$ to $1 \times 10^{18}$ cm$^{-3}$.

By thus providing the p-type high-concentration regions 191, the junction between the source/drain diffusion regions 112 and 113 and the semiconductor substrate 111 becomes steep just under the memory function bodies 161 and 162. Therefore, hot carriers tend to easily occur during the write and erase operations, and this allows the voltage of the write operation and the erase operation to be lowered or allows the operation speed of the write operation and the erase operation to be increased. Furthermore, the impurity concentration of the region 192 located just below the gate electrode is comparatively low. Therefore, when the memory is in the erased state, a threshold value is low, and the drain current becomes large. Consequently, the read speed is improved. Accordingly, there can be obtained a semiconductor storage element, in which the rewrite voltage is low or the rewrite speed is high, and the read speed is high.

Moreover, by providing the p-type high-concentration regions 191 near the source/drain regions and below the memory function bodies (i.e., not just below the gate electrode 117) in FIG. 14, the threshold value of the entire transistor is remarkably raised. The degree of rise is remarkably larger than in the case where a p-type high-concentration region is provided just below the gate electrode 117. When write electric charge (electrons when the transistor is the n-channel type) is accumulated in the memory function bodies 161 and 162, this difference becomes larger. When erase electric charge (positive holes when the transistor is the n-channel type) sufficient for the memory function bodies 161 and 162 is accumulated, the threshold value of the entire transistor is reduced to a threshold value determined by the impurity concentration of the region 192 located just below the gate electrode. That is, the threshold value during erase does not depend on the impurity concentration of the p-type high-concentration regions 191, while the threshold value during write is significantly influenced by the impurity concentration of the p-type high-concentration regions 191. Therefore, by arranging the p-type high-concentration regions 191 below the memory function bodies 161 and 162 and near the source/drain regions, only the threshold value during write can be largely changed, and consequently, the memory effect (difference in the threshold value between write and erase) can be remarkably increased.

Tenth Embodiment

Figure 15:
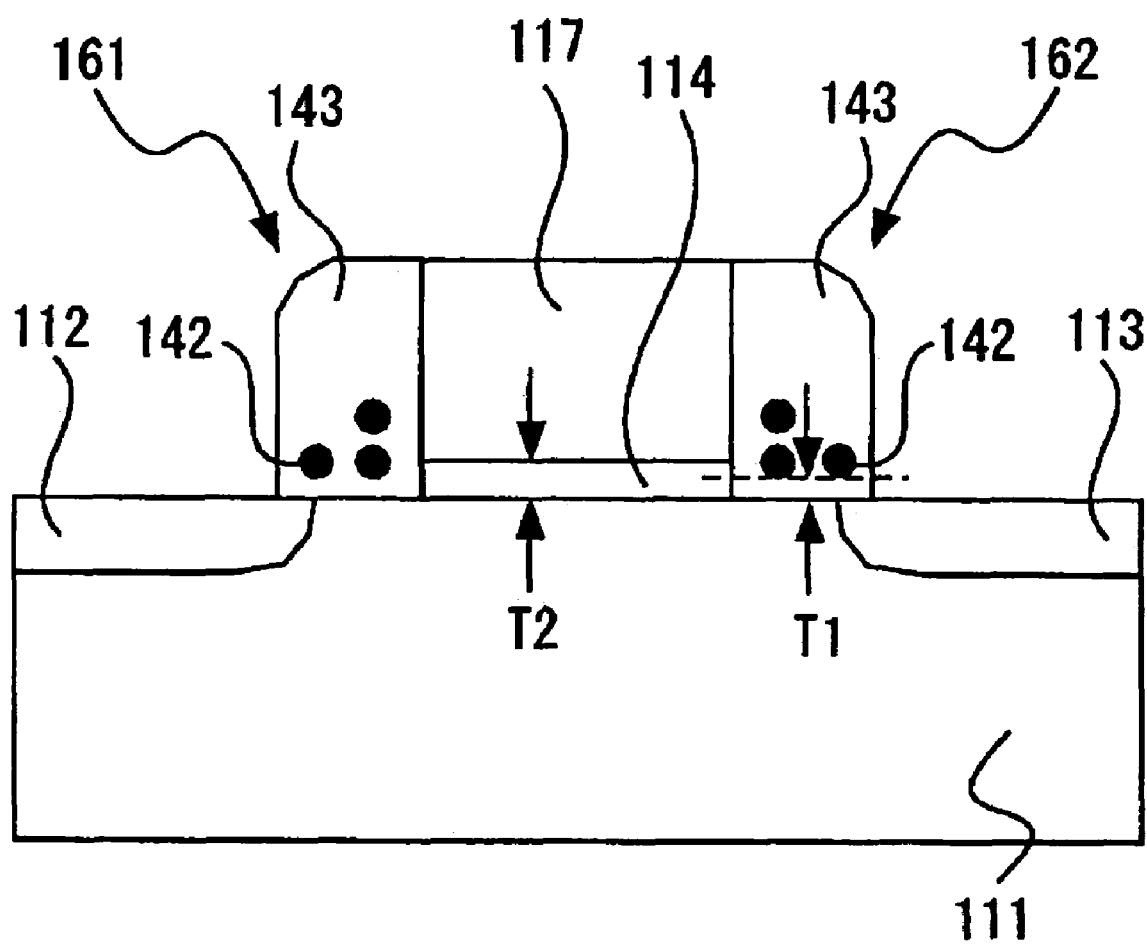
FIG. 15 is a sectional view showing a semiconductor storage element according to a tenth embodiment of the present invention.

As shown in FIG. 15, the semiconductor storage element of a tenth embodiment has substantially the same construction as that of the semiconductor storage element of the sixth embodiment except for the arrangement that a thickness T1 (illustrated as a distance between the dashed line that connects the lower end portions of the silicon particles and the semiconductor substrate) of a lower end portion of the sidewall insulator 143, which is a portion that separates the silicon particles 142 included in the charge retention portions of the memory function bodies 161 and 162 from the channel forming region or the well region, is smaller than a thickness (T2) of the gate insulator 114. The components having the same functions as those of the sixth embodiment are denoted by same reference numerals, and no detailed description is provided therefor.

Because of the demanded withstand voltage during the memory rewrite operation, the thickness T2 of the gate insulator 114 has a lower limit. However, regardless of the demanded withstand voltage, the thickness T1 of the lower end portion of the sidewall insulator 143 of the memory function bodies 161 and 162 can be made thinner than T2. By reducing this thickness T1, the electric charge injection into the particles 142 of the memory function bodies is facilitated, and this allows the voltage of the write operation and the erase operation to be lowered or allows the speed of the write operation and the erase operation to be increased. Moreover, the amount of electric charge induced in the channel forming region or the well region when electric charge is accumulated in the silicon particles 142 increases, and therefore, the memory effect can be increased.

Therefore, by setting T1<TG, it becomes possible to lower the voltage of the write operation and the erase operation or increase the speed of the write operation and the erase operation and further increase the memory effect without deteriorating the withstand voltage performance of the memory.

With regard to the thickness T1 of the lower end of the sidewall insulator 143, thickness uniformity and film quality can be maintained at a specified level in the manufacturing processes, and the thickness should more preferably be not smaller than 0.8 nm, which is the critical thickness with which the charge retention characteristic does not extremely deteriorate.

Eleventh Embodiment

Figure 16:
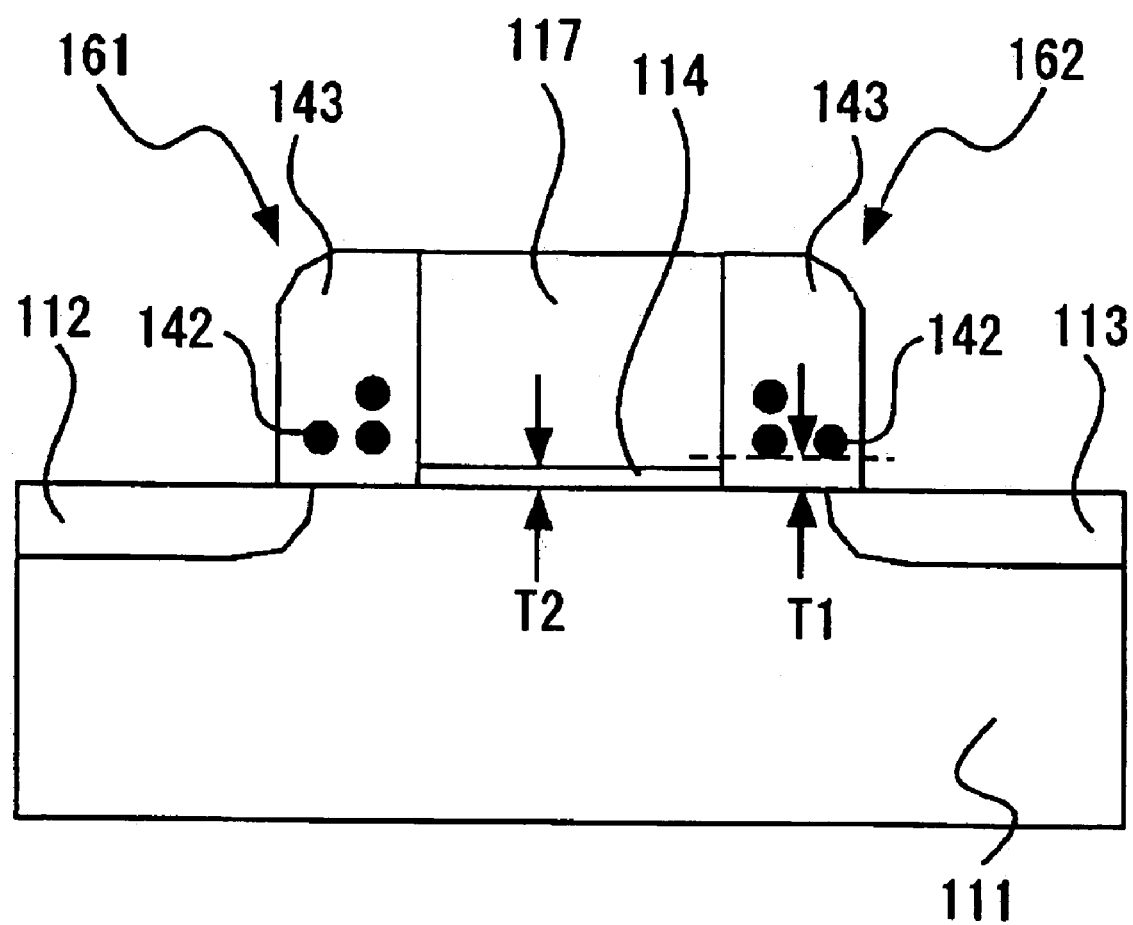
FIG. 16 is a sectional view showing a semiconductor storage element according to an eleventh embodiment of the present invention.

As shown in FIG. 16, the semiconductor storage element of an eleventh embodiment has substantially the same construction as that of the semiconductor storage element of the sixth embodiment except for the arrangement that the thickness T1 (illustrated as a distance between the dashed line that connects the lower end portions of the silicon particles and the semiconductor substrate) of a lower end portion of the sidewall insulator 143, which is a portion that separates the silicon particles 142 included in the charge retention portions of the memory function bodies 161 and 162 from the channel forming region or the well region, is greater than the thickness T2 of the gate insulator 114. The components having the same functions as those of the sixth embodiment are denoted by same reference numerals, and no detailed description is provided therefor.

Because of demand for preventing the short-channel effect of the device, the thickness T2 of the gate insulator 114 has an upper limit. However, regardless of the demand for preventing the short-channel effect, the thickness T1 of the lower end portion of the sidewall insulator 143 can be made thicker than T2. By making the thickness T1 of the lower end portion of the sidewall insulator 143 thicker than T2, it becomes possible to prevent the dispersion of the electric charge accumulated in the silicon particles 142 and improve the retention characteristic of the memory.

Therefore, by setting T1>T2, the retention characteristic can be improved without degrading the short-channel effect of the memory.

The thickness T1 of the lower end portion of the sidewall dielectric film 143 should preferably be not greater than 20 nm in consideration of a reduction in the rewrite speed.

Twelfth Embodiment

Figure 17A:
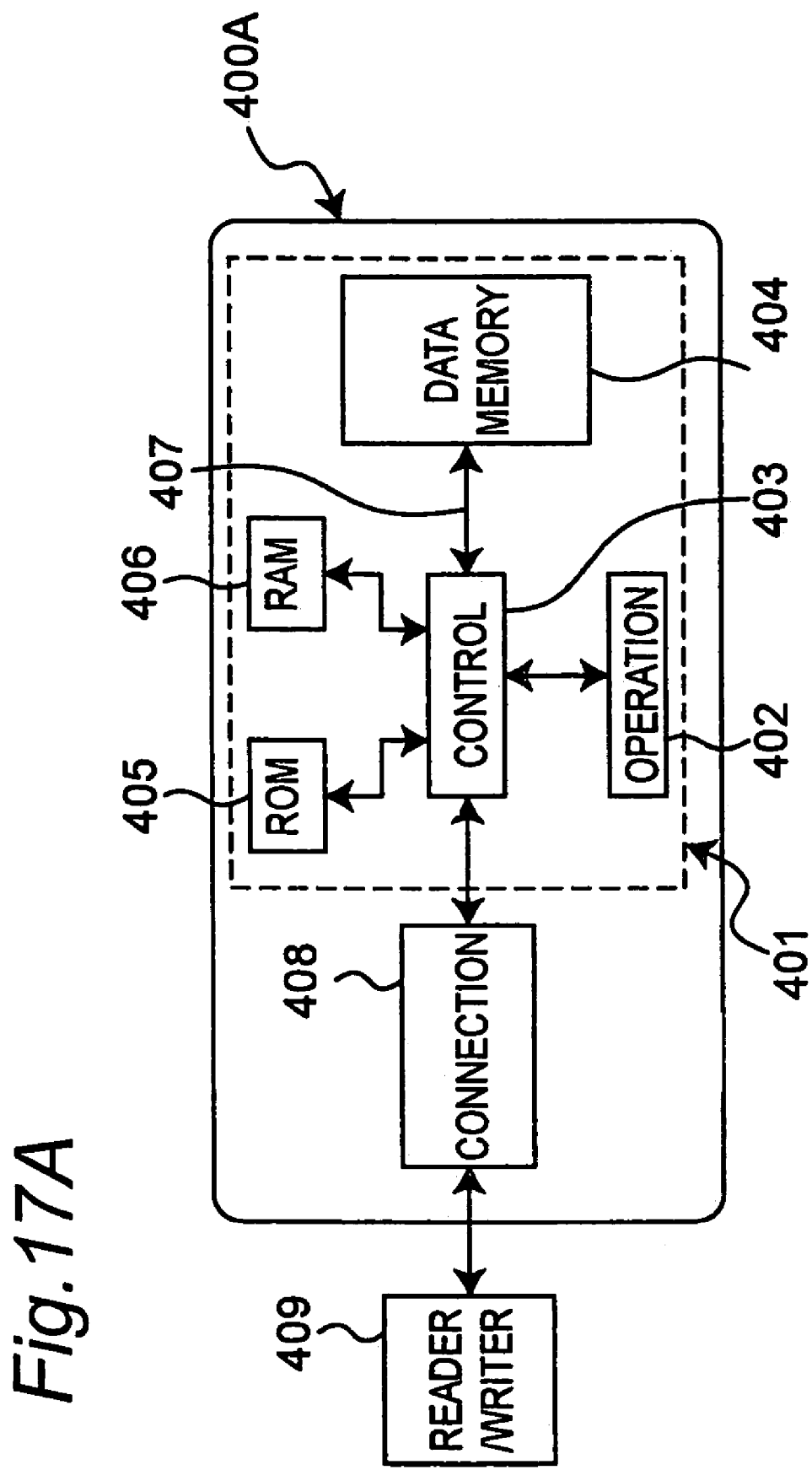
FIGS. 17A and 17B are views showing an IC card according to a twelfth embodiment of the present invention.
Figure 17B:
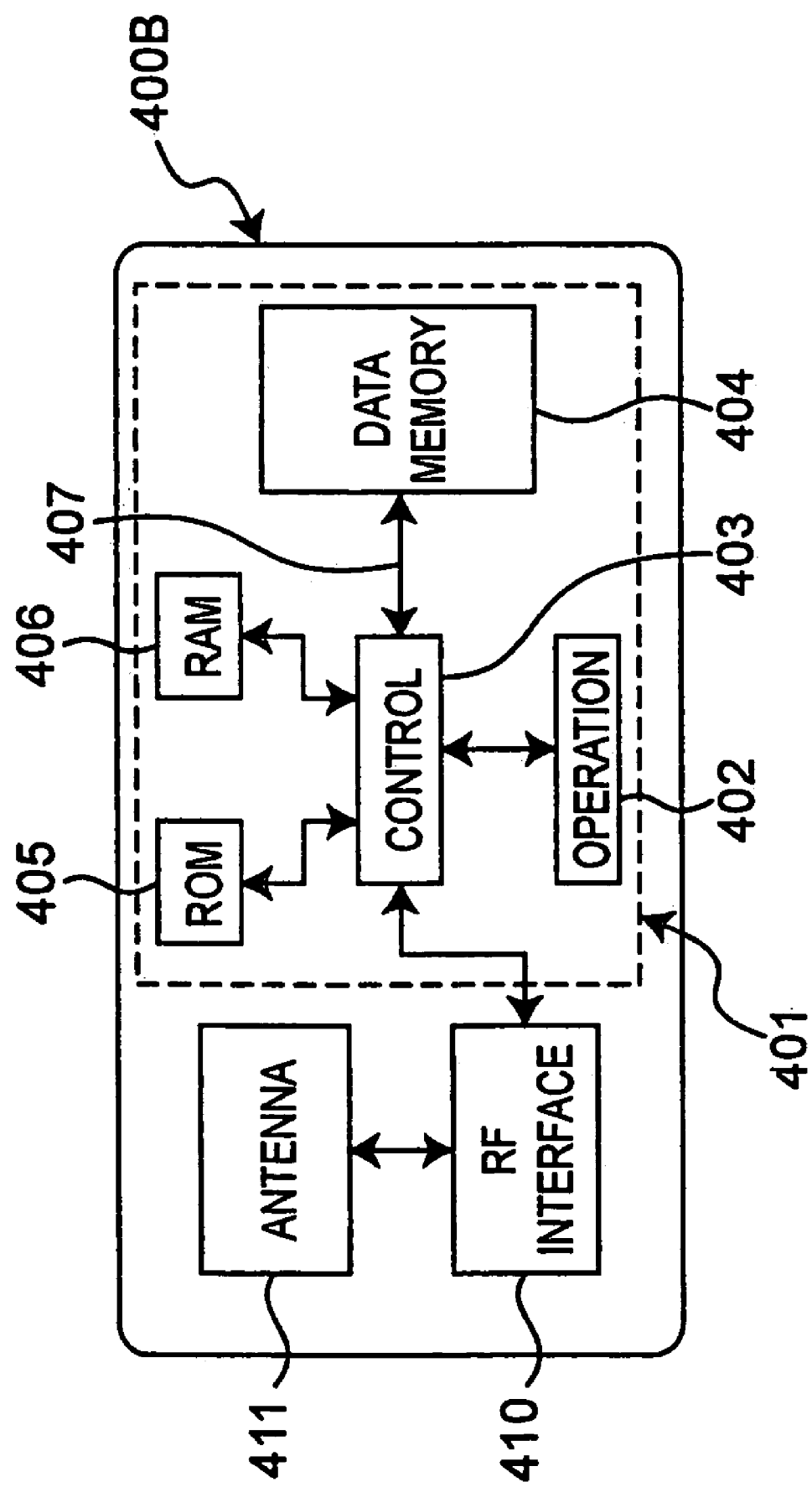

With reference to FIGS. 17A and 17B, a twelfth embodiment of the present invention will be described.

In this embodiment, IC cards 400A and 400B are made by using the semiconductor devices of the present invention.

As shown in FIG. 17A, the IC card 400A has a built-in MPU (Micro Processing Unit) 401 and a built-in connection section 408. The MPU 401 has a data memory section 404, an operation section 402, a control section 403, a ROM (Read Only Memory) 405 and a RAM (Random Access Memory) 406, all of which are formed in one chip. The MPU 401 is made by using the semiconductor device of an embodiment of the present invention. Each constituent section of the MPU 401 is connected with one another via lines (including a data bus and a power source line) 407. The connection section 408 is connected to the reader/writer 409 that reads and writes data of the IC card 400A. Via the connection section 408, an electric power is supplied from the reader/writer 409 and data is transmitted to and from the reader/writer 409.

The IC card 400A of this embodiment is characterized in that the MPU 401 is composed of the data memory section 404 and the operation section 402 which are incorporated in one semiconductor chip. The data memory section 404 is made by using the semiconductor storage elements of an embodiment of the present invention. As explained in the first embodiment, the semiconductor storage elements are easily miniaturized and allow two-bit operations. This facilitates reduction of the area in a memory cell array formed by these semiconductor storage elements. Therefore, the memory cell array can be fabricated at reduced cost and application of this memory cell array to the data memory section 404 reduces the cost of the IC card 400A.

Further, because the MPU section 401, which incorporates the data memory section 404, is formed in one chip, the production cost of the IC card 400A can be largely reduced.

Further, the data memory section 404 uses the semiconductor storage elements and other circuits use the semiconductor switching elements. In other words, the MPU 401 has the semiconductor devices according to an embodiment of the present invention. Therefore, as compared with a case in which the data memory section 404 uses for example flash memories, in comparatively easier and less fabrication process, it is possible to make the semiconductor switching elements constituting the logic circuits, such as the operation section 402 and the control section 403, and the semiconductor storage elements constituting the data memory section 404. The simplified process allows to produce at lower cost the MPU section where the operation section 402 and the data memory section 404 are incorporated.

The ROM 405 in the MPU section 401 may be constructed of the semiconductor storage elements according to an embodiment of the present invention. This makes it possible to externally rewrite the ROM 405, which brings about remarkable increase of the functions of the IC card 400A. Because the above semiconductor storage elements are easy to miniaturize and allow two-bit operations, substituting these semiconductor storage elements for the memory cells of the masked ROM would hardly cause increase of a chip area. Also, the process for forming the semiconductor storage elements is almost the same as the general CMOS forming process, which facilitates mixed-placing of the semiconductor storage elements with the logic circuit.

FIG. 17B shows a modification of the IC card. As shown in FIG. 17B, the IC card 400B incorporates an MPU section 401, an RF interface section 410 and an antenna section 411. The MPU section 401 contains a data memory section 404, an operation section 402, a control section 403, a ROM 405, and a RAM 406, all of which are formed in one chip. The sections 402, 403, 404, 405, 406, 410, and 411 are connected to one another via lines (including a data bus and a power source line) 407.

The IC card 400B of FIG. 17B is different from the IC card 400A of FIG. 17A in that the IC card 400B is of non-contact type. Consequently, the control section 403 is connected not to the connection section but to the RF interface section 410. The RF interface section 410 is further connected to the antenna section 411. The RF interface section 410 has a function of communicating with external equipment and a function of power collection. The RF interface section 410 has a function of commutating high-frequency signals transmitted from the antenna section 411 and feeding power, and a function of modulating and demodulating signals. It is noted that the RF interface section 410 and the antenna section 411 may be placed together with the MPU 401 in one chip.

Since the IC card 400B shown in FIG. 17B is of non-contact type, it becomes possible to prevent electrostatic destruction which would occur through the connection section. Also, the IC card does not necessarily need to have a close contact with an external apparatus, which makes freedom of applications large. In addition, the semiconductor storage elements constituting the data memory section 404 each operate at low supply voltage (for example about 9V), compared with conventional flash memory cells (supply voltage of about 12V), which enables downsizing of the circuit of the RF interface section 410 and enables cost reduction.

Thirteenth Embodiment

Figure 18:
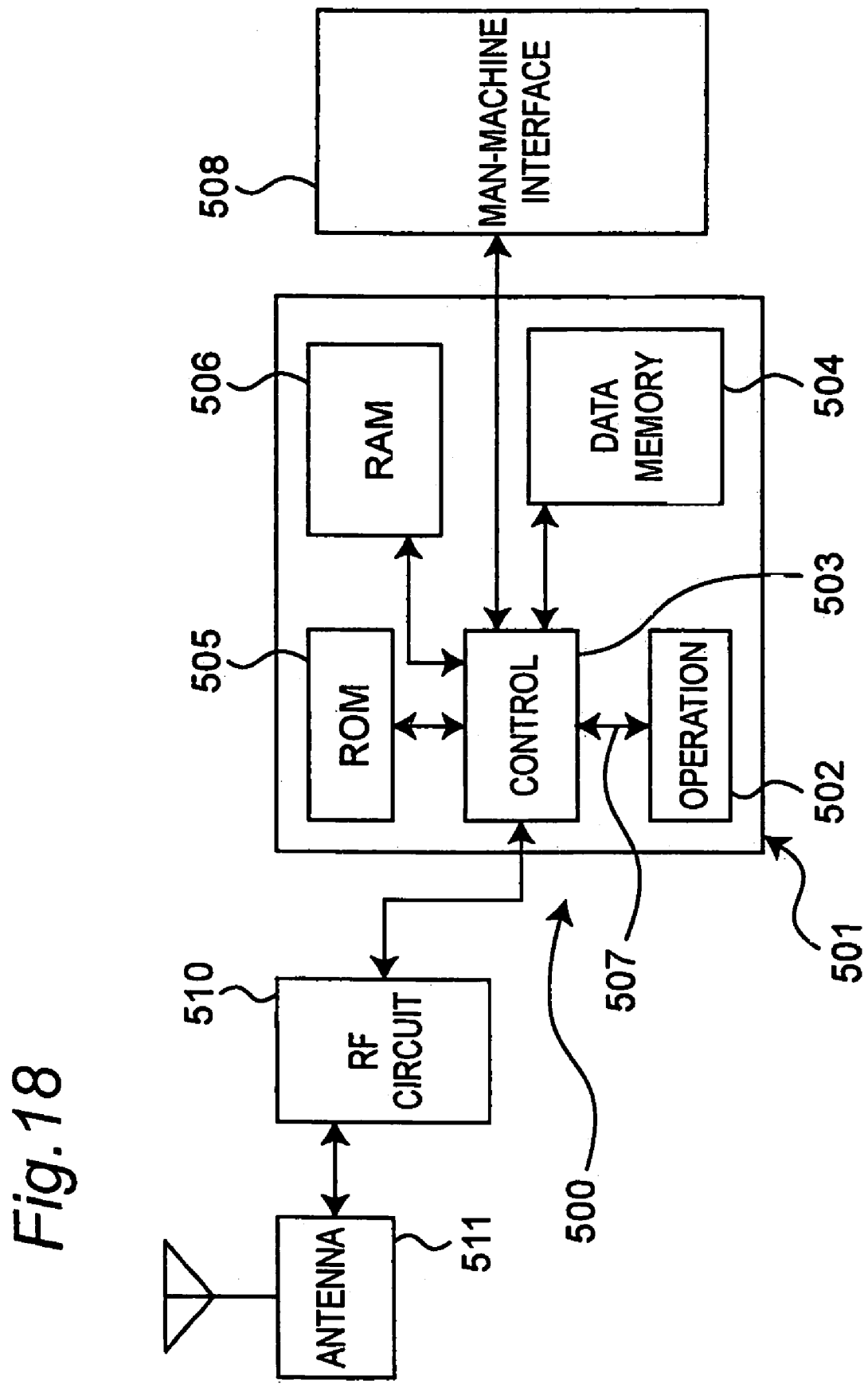
FIG. 18 is a view showing portable electronic equipment according to a thirteenth embodiment of the present invention.
Figure 19:
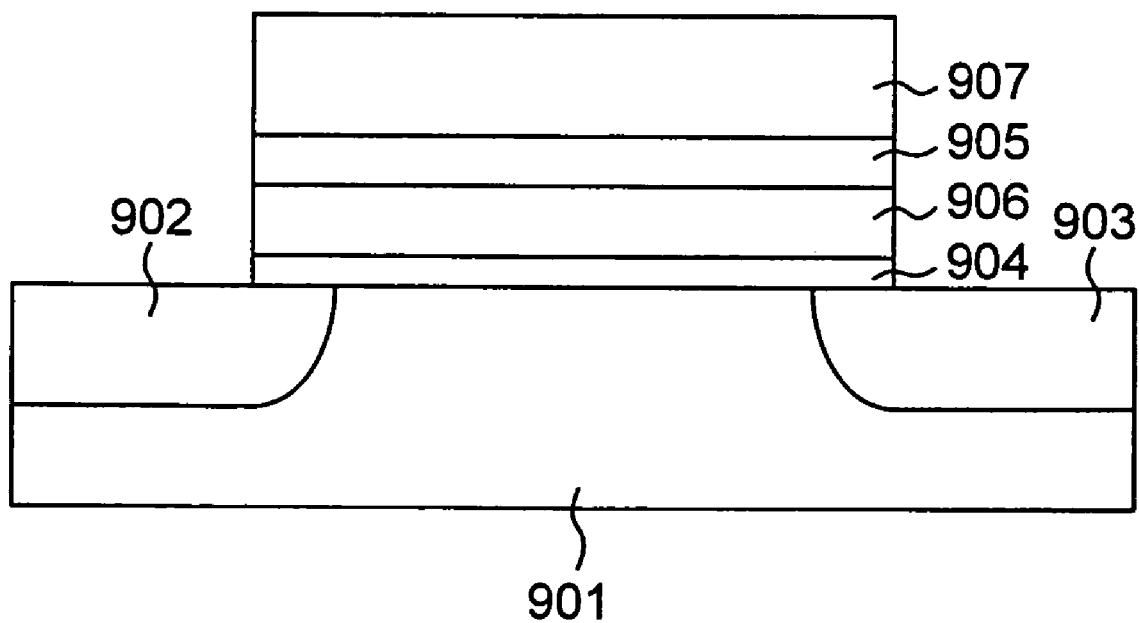
FIG. 19 is a sectional view showing a conventional flash memory.

With reference to FIG. 18, a thirteenth embodiment of the present invention will be described.

The semiconductor device of various embodiments of the present invention is applicable to battery-driven portable electronic equipment, especially to mobile phones. The other portable electronic equipment includes handheld terminals, game machines and the like.

FIG. 18 shows a block diagram of a mobile phone 500 according to an embodiment of the present invention.

The mobile phone 500 incorporates an MPU section 501, a man-machine interface section 508, an RF circuit section 510, and an antenna section 511. The MPU section 501 has a data memory section 504, an operation section 502, a control section 503, a ROM 505, and a RAM 506, all of these being formed in one chip. Programs for operating the MPU 501 are stored in the ROM 505. The RAM 506 is used as a work area and temporarily stores operation data. The semiconductor device according to an embodiment of the present invention is incorporated in the MPU 501. The constituent parts or sections 502, 503, 504, 505, 506, 508, 510 and 511 are connected with one another via lines (including a data bus and a power source line) 507.

The mobile phone 500 is characterized in that the MPU 501 incorporates the data memory section 504 and that the semiconductor switching elements and the semiconductor storage elements are placed together in one semiconductor chip.

The data memory section 504 is constructed by the memory alley made with use of the semiconductor storage elements according to an embodiment of the present invention, which reduces production costs. These semiconductor storage elements are easily miniaturized and allow two-bit operations, which easily reduces an area of the memory cell array. Therefore, with high performance and at greatly reduced cost, it is possible to fabricate the MPU 501 provided with the data memory section 504 including the memory array.

Further, in the MPU 501, the data memory section 504 is made by using the semiconductor device according to an embodiment of the present invention, and other circuits is made by using the semiconductor switching elements according to an embodiment of the present invention. That is, the MPU 501 is constructed by using the semiconductor device according to an embodiment of the present invention. Therefore, the operation section 502 and the control section 503 and the data memory section 504 are easily made in parallel by the simplified consolidation process. As a result, since the production cost of the MPU section 501 is effectively reduced, the mobile phone 500 of the present embodiment is effectively reduced. Also, the highly-functional MPU section 501 is inexpensively produced by constructing RAM 506 in the MPU section 501 with use of SRAM having the semiconductor switching elements according to the present invention. Thereby, the mobile phone 500 having the above-stated MPU section 501 highly functions and effectively reduces the cost.

The ROM 505 in the MPU 501 may be constructed of the above-described semiconductor storage elements. This makes it possible to externally rewrite the ROM 505, which brings about remarkable increase of the functions of the mobile phone. Because the above semiconductor storage elements are easy to miniaturize and allow two-bit operations, substituting these semiconductor storage elements for the memory cells of the masked ROM would hardly cause increase of a chip area. Also, the process for forming the semiconductor storage elements is almost the same as the general CMOS forming process, which make it possible to easily place the ROM together with the operation section and the control section.

The mobile phone 500 using the semiconductor device of an embodiment of the present invention allows its production cost to be reduced because of reduction in production cost of the control circuit thereof as stated above. Also, an increase in capacity of the semiconductor storage elements, which are placed with the control circuit, improves the function of the portable electronic equipment.

The invention being thus described in terms of several embodiments, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor storage element comprising:
a gate electrode formed on a semiconductor substrate via a gate insulator;
a channel forming region located below the gate electrode;
a pair of source/drain diffusion regions formed on opposite sides of the channel forming region and having a conductive type opposite to a conductive type of the channel forming region; and
a first memory function body arranged on a first side of the gate electrode and a second memory function body arranged on a second side of the gate electrode opposite said first side and spaced from said first side, wherein the memory function bodies are each formed of:
a plurality of charge retention portions constructed of particles having a function to accumulate electric charge and dielectric films formed on surfaces of the particles, having a function to prevent the electric charge from dispersing and having a roughly uniform film thickness and
an insulator that covers the plurality of charge retention portions, and wherein
an amount of electric charge retained in the memory function bodies varies an amount of a current which flows from one source/drain diffusion region to the other source/drain diffusion region when a voltage is applied to the gate electrode.

2. The semiconductor storage element as claimed in claim 1, wherein
an interval is provided between the gate electrode and the source/drain diffusion regions in a gate length direction.

3. The semiconductor storage element as claimed in claim 1, wherein
the gate electrode is a single gate electrode, and
the single gate electrode functions as one word line and is associated with the memory function bodies.

4. A semiconductor storage element comprising:
a single gate electrode formed on a semiconductor substrate via a gate insulator;
a channel forming region located below the gate electrode;
a pair of source/drain diffusion regions formed on opposite sides of the channel forming region and having a conductive type opposite to a conductive type of the channel forming region, an interval being provided between the gate electrode and the source/drain diffusion regions in a gate length direction and no gate electrode existing above the interval and no source/drain diffusion region existing below the gate electrode; and
memory function bodies arranged on opposite sides of the gate electrode, wherein
the single gate electrode functions as one word line and is associated with the memory function bodies, wherein
each memory function body has:
particles having a function to accumulate electric charge and
an insulator formed around each particle and having a function to prevent the electric charge from dispersing, and wherein
an amount of electric charge retained in the memory function body varies an amount of a current which flows from one source/drain diffusion region to the other source/drain diffusion region when a voltage is applied to the gate electrode.

5. A semiconductor storage element comprising:
a gate electrode formed on a semiconductor substrate via a gate insulator;
a channel forming region located below the gate electrode;
a pair of source/drain diffusion regions formed on opposite sides of the channel forming region and having a conductive type opposite to a conductive type of the channel forming region; and
memory function bodies arranged on opposite sides of the gate electrode, wherein
each memory function body has:
particles having a function to accumulate electric charge and an insulator formed around each particle and having a function to prevent the electric charge from dispersing, the insulator comprising a first insulator formed on a surface of each particle and a second insulator surrounding the first insulator, and wherein an amount of electric charge retained in the memory function body varies an amount of a current which flows from one source/drain diffusion region to the other source/drain diffusion region when a voltage is applied to the gate electrode.

6. The semiconductor storage element as claimed in claim 5, wherein
the first insulator has a roughly uniform film thickness.

7. The semiconductor storage element as claimed in claim 5, wherein
the first insulator is made of a same material as that of the second insulator so that there is no boundary between the first and second insulators.

8. A semiconductor storage element comprising:
a gate electrode formed on a semiconductor substrate via a gate insulator;
a channel forming region located below the gate electrode;
a pair of source/drain diffusion regions formed on opposite sides of the channel forming region and having a conductive type opposite to a conductive type of the channel forming region; and
two separate memory function bodies arranged on opposite sides of the gate electrode but not an upper side of the gate electrode, wherein
each memory function body has:
particles having a function to accumulate electric charge; and
an insulator formed around each particle and having a function to prevent the electric charge from dispersing, and wherein
an amount of electric charge retained in the memory function body varies an amount of a current which flows from one source/drain diffusion region to the other source/drain diffusion region when a voltage is applied to the gate electrode, and wherein
an interval is provided between the gate electrode and the source/drain diffusion regions in a gate length direction and no gate electrode exists above the interval and no source/drain diffusion region exists below the gate electrode.

* * * * *